United States Patent
Huang et al.

(10) Patent No.: US 8,971,039 B2
(45) Date of Patent: *Mar. 3, 2015

(54) BATTERY PACK, HOLSTER, AND EXTENDIBLE PROCESSING AND INTERFACE PLATFORM FOR MOBILE DEVICES

(75) Inventors: Daniel Huang, Irvine, CA (US); Matthew Brand, Brooklyn, NY (US)

(73) Assignee: Mophie, Inc., Tustin, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/938,351

(22) Filed: Nov. 2, 2010

(65) Prior Publication Data

US 2011/0159324 A1    Jun. 30, 2011

Related U.S. Application Data

(60) Division of application No. 12/357,262, filed on Jan. 21, 2009, which is a continuation-in-part of application No. 12/356,068, filed on Jan. 19, 2009, now abandoned.

(60) Provisional application No. 61/021,897, filed on Jan. 18, 2008.

(51) Int. Cl.
| | |
|---|---|
| *H05K 5/00* | (2006.01) |
| *H05K 7/00* | (2006.01) |
| *G06F 1/16* | (2006.01) |
| *H01M 2/10* | (2006.01) |
| *H01M 10/46* | (2006.01) |

(52) U.S. Cl.
CPC ............ *H01M 2/1022* (2013.01); *H01M 10/46* (2013.01); *H01M 2220/30* (2013.01)
USPC .................................. 361/679.56; 361/679.41

(58) Field of Classification Search
USPC ......... 361/679.55, 679.56, 679.41; 206/308.3
See application file for complete search history.

(56) References Cited

U.S. PATENT DOCUMENTS

| | | |
|---|---|---|
| 5,001,772 A | 3/1991 | Holcomb et al. |
| 5,368,159 A | 11/1994 | Doria |

(Continued)

OTHER PUBLICATIONS

Mophie Juice Pack iPhone 1G Product Reference, May 1, 2008, 22 pages.

(Continued)

*Primary Examiner* — Anthony Haughton
(74) *Attorney, Agent, or Firm* — Knobbe Martens Olson & Bear LLP

(57) ABSTRACT

A battery pack is provided for a mobile communication device, comprising a casing defining a cavity that conforms, at least partially, to the outer shape of the mobile communication device and one or more rechargeable power cells housed within the thickness of the casing. An internal interface engages a corresponding interface on the mobile communication device to provide power from the one or more rechargeable cells to the mobile communication device. An external interface is electrically coupled to the internal interface in order to transmit signals from the mobile communication device to an external device and may further serve to recharge the one or more rechargeable power cells. The battery pack may also serve as an extendible platform by providing additional integrated communication interfaces and/or processors that can be utilized by the mobile communication device to extend its communication and/or processing capabilities.

50 Claims, 21 Drawing Sheets

(56) References Cited

U.S. PATENT DOCUMENTS

| | | | |
|---|---|---|---|
| 5,508,123 A | 4/1996 | Fan | |
| D372,896 S | 8/1996 | Nagele et al. | |
| 5,586,002 A | 12/1996 | Notarianni | |
| 5,604,050 A | 2/1997 | Brunette et al. | |
| 5,610,979 A | 3/1997 | Yu | |
| 5,708,707 A | 1/1998 | Halttlunen et al. | |
| 5,711,013 A | 1/1998 | Collett et al. | |
| D392,248 S | 3/1998 | Johansson | |
| D392,939 S | 3/1998 | Finke-Anlauff | |
| 5,786,106 A | 7/1998 | Armani | |
| D400,495 S | 11/1998 | Deslyper et al. | |
| 5,864,766 A | 1/1999 | Chiang | |
| 5,973,477 A | 10/1999 | Chang | |
| 6,043,626 A | 3/2000 | Snyder et al. | |
| 6,171,138 B1 | 1/2001 | LeFebvre et al. | |
| 6,184,654 B1 | 2/2001 | Bachner, III et al. | |
| 6,208,115 B1 | 3/2001 | Binder | |
| 6,317,313 B1* | 11/2001 | Mosgrove et al. | 361/679.3 |
| 6,324,380 B1 | 11/2001 | Kiuchi et al. | |
| D460,411 S | 7/2002 | Wang | |
| 6,538,413 B1 | 3/2003 | Beard et al. | |
| 6,555,990 B1 | 4/2003 | Yang | |
| 6,614,722 B2 | 9/2003 | Polany et al. | |
| 6,992,461 B2 | 1/2006 | Liang et al. | |
| 7,166,987 B2* | 1/2007 | Lee et al. | 320/114 |
| D547,056 S | 7/2007 | Griffin et al. | |
| D547,057 S | 7/2007 | Griffin et al. | |
| D556,681 S | 12/2007 | Kim | |
| D558,972 S | 1/2008 | Oh | |
| D558,973 S | 1/2008 | Hussaini et al. | |
| D561,092 S | 2/2008 | Kim | |
| 7,336,973 B2 | 2/2008 | Goldthwaite et al. | |
| 7,400,917 B2* | 7/2008 | Wood et al. | 455/575.8 |
| D575,056 S | 8/2008 | Tan | |
| 7,428,427 B2 | 9/2008 | Brunstrom et al. | |
| D581,151 S | 11/2008 | Aipa | |
| D582,149 S | 12/2008 | Tan | |
| 7,479,759 B2 | 1/2009 | Vilanov et al. | |
| D587,896 S | 3/2009 | Aipa | |
| 7,612,997 B1* | 11/2009 | Diebel et al. | 361/679.56 |
| 7,663,878 B2 | 2/2010 | Swan et al. | |
| 7,778,023 B1 | 8/2010 | Mohoney | |
| 7,782,610 B2* | 8/2010 | Diebel et al. | 361/679.56 |
| 7,889,489 B2 | 2/2011 | Richardson et al. | |
| 2001/0054148 A1 | 12/2001 | Hoornaert et al. | |
| 2002/0147035 A1 | 10/2002 | Su | |
| 2003/0096642 A1 | 5/2003 | Bessa et al. | |
| 2003/0218445 A1 | 11/2003 | Behar | |
| 2003/0228866 A1 | 12/2003 | Pezeshki | |
| 2004/0097256 A1 | 5/2004 | Kujawski | |
| 2004/0104268 A1 | 6/2004 | Bailey | |
| 2005/0090301 A1 | 4/2005 | Lange et al. | |
| 2005/0231159 A1 | 10/2005 | Jones et al. | |
| 2005/0247787 A1 | 11/2005 | Von Mueller et al. | |
| 2005/0248312 A1 | 11/2005 | Cao et al. | |
| 2006/0058073 A1 | 3/2006 | Kim | |
| 2006/0063569 A1 | 3/2006 | Jacobs et al. | |
| 2006/0099999 A1 | 5/2006 | Park | |
| 2006/0105722 A1 | 5/2006 | Kumar | |
| 2007/0152633 A1 | 7/2007 | Lee | |
| 2007/0167190 A1 | 7/2007 | Moosavi et al. | |
| 2007/0236180 A1 | 10/2007 | Rodgers | |
| 2007/0297149 A1 | 12/2007 | Richardson et al. | |
| 2008/0007214 A1 | 1/2008 | Cheng | |
| 2008/0096620 A1 | 4/2008 | Lee et al. | |
| 2008/0108395 A1 | 5/2008 | Lee et al. | |
| 2008/0123287 A1* | 5/2008 | Rossell et al. | 361/686 |
| 2008/0132289 A1 | 6/2008 | Wood et al. | |
| 2009/0069050 A1 | 3/2009 | Jain et al. | |
| 2009/0073650 A1 | 3/2009 | Huang et al. | |
| 2009/0143104 A1 | 6/2009 | Loh et al. | |
| 2009/0144456 A1 | 6/2009 | Gelf et al. | |
| 2009/0186264 A1 | 7/2009 | Huang | |
| 2010/0026589 A1 | 2/2010 | Dou et al. | |
| 2010/0064883 A1 | 3/2010 | Gynes | |

OTHER PUBLICATIONS

Horwitz, Jeremy; "Kensington Mini Battery Pack and Charger for iPhone and iPod," iLounge; May 16, 2008; available at http://www.ilounge.com/index.php/reviews/entry/kensington-mini-battery-pack-and -charger-for-iphone-and-ipod/; retrieved May 12, 2009; 3 pages.

Rafferty, Sven; Mybat External Battery for iPone and iPod; SvenOnTech; May 18, 2008; available at <http://sventech,com/reviews/?p=74>; retrieved May 12, 2009; 4 pages.

Rees, Dave; "Richard Solo Backup Battery for iPhone/iPod Review," The Gadgeteer Jun. 16, 2008; available at http://the-gadgeteer.com/2008/06/16/richard_solo_backup_battery_for_iphone_ipod/; retrieved May 12, 2009; 8 pages.

"Cheap DIY iPhone External Battery"; Michael Fisher's Web Log; Jul. 22, 2008; available at http://fastdad.wordpress.com/2008/07/22/cheap-diy-iphone-external-battery/>; retrieved May 12, 2009 10 pages.

Mophie Juice Pack iPhone 3G Product Reference, Aug. 4, 2008, 33 pages.

"Mini Battery Pack and Charger for iPhone and iPod," Kensington; Sep. 30, 2008; available at http://files.acco.com/KENSINGTON/K33442US/K33442US-usconsumer.pdf; retrieved May 12, 2009., 1 page.

Coldewey, Devin; "Combination iPhone battery pack and flash from FastMac," *CrunchGear*; Nov. 4, 2008; available at http://www.crunchgear.com/2008/11/04/combination-iphone-battery-pack-and-flash-from-fastmac/>; retrieved May 12, 2009; 3 pages.

Horwitz, Jeremy; "iLuv i603/i604 Rechargeable Lithium Polymer Batteries with Silicone Skin," iLounge; Jun. 27, 2006 available at http://www.ilounge.com/index.php/reviews/iluv-i603-rechargeable-lithium-polymer-battery-with-silicone-skin/>; retrieved May 12, 2009; 3 pages.

International Search Report and Written Opinion under Patent Cooperation Treat (PCT) for PCT/US2011/037254; Jul. 13, 2011; 12 pages.

International Search Report and Written Opinion under Patent Cooperation Treat (PCT) for PCT/US2011/037244; Jul. 19, 2011; 8 pages.

International Search Report and Written Opinion under Patent Cooperation Treat (PCT) for PCT/US2011/0037249; Jul. 13, 2011; 11 pages.

LivingSocial's Answer to Mophie's Fifth Amended Complaint and Counterclaims, filed Sep. 24, 2014, in *Mophie, Inc.* v. *Source Vista*, Case No. 8:13-CV-01321 in the United States District Court for the Central District of California.

Shah's Answer, Affirmative Defenses, and Counterclaims to Plaintiff's Fifth Amended Complaint, filed Sep. 24, 2014, in *Mophie, Inc.* v. *Source Vista*, Case No. 8:13-CV-01321 in the United States District Court for the Central District of California.

Expert Report of Dr. David Munson, dated Aug. 28, 2014, in *Mophie, Inc.* v. *Source Vista*, Case No. 8:13-CV-01321 in the United States District Court for the Central District of California.

Expert Report of John Feland, Ph.D, dated Aug. 28, 2014, in *Mophie, Inc.* v. *Source Vista*, Case No. 8:13-CV-01321 in the United States District Court for the Central District of California.

Rebutal Expert Report of John Feland, Ph.D, dated Sep. 25, 2014, in *Mophie, Inc.* v. *Source Vista*, Case No. 8:13-CV-01321 in the United States District Court for the Central District of California.

Rebutal Expert Report of Dr. David Munson, dated Sep. 25, 2014, in *Mophie, Inc.* v. *Source Vista*, Case No. 8:13-CV-01321 in the United States District Court for the Central District of California.

Mophie's Second Amended Response to LivingSocial's Interrogatory No. 1[21], dated Aug. 28, 2014, in *Mophie, Inc.* v. *Source Vista*, Case No. 8:13-CV-01321 in the United States District Court for the Central District of California.

Mophie's Second Amended Response to Serve Global's Interrogatory No. 2, dated Aug. 28, 2014, in *Mophie, Inc.* v. *Source Vista*, Case No. 8:13-CV-01321 in the United States District Court for the Central District of California.

(56) References Cited

OTHER PUBLICATIONS

Defendant's Memorandum in Support of Motion for Partial Summary Judgement, dated Sep. 23, 2014, in *Mophie, Inc.* v. *Source Vista*, Case No. 8:13-CV-01321 in the United States District Court for the Central District of California.
Declaration of David Munson in Support of Defendant's Motion for Partial Summary Judgment, dated Sep. 22, 2014, in *Mophie, Inc.* v. *Source Vista*, Case No. 8:13-CV-01321 in the United States District Court for the Central District of California.
John Feland, Ph.D. Deposition Transcript, dated Sep. 30, 2014, in *Mophie, Inc.* v. *Source Vista*, Case No. 8:13-CV-01321 in the United States District Court for the Central District of California.
Defendants' Statement of Uncontroverted Material Fact and Contentions of Law, filed Sep. 22, 2014 in *Mophie, Inc.* v. *Source Vista*, Case No. 8:13-CV-01321 in the United States District Court for the Central District of California.
Memorandum of Points and Authorities in Support of Mophie's Motion for Summary Judgment, filed Sep. 22, 2014, in *Mophie, Inc.* v. *Source Vista*, Case No. 8:13-CV-01321 in the United States District Court for the Central District of California.
Statement of Uncontroverted Facts and Conclusions of Law in Support of Mophie's Motion for Summary Judgment, filed Sep. 22, 2014, in *Mophie, Inc.* v. *Source Vista*, Case No. 8:13-CV-01321 in the United States District Court for the Central District of California.
Mophie's Opposition to Shah and Serve Global's Motion for Partial Summary Judgment, dated Oct. 3, 2014, in *Mophie, Inc.* v. *Source Vista*, Case No. 8:13-CV-01321 in the United States District Court for the Central District of California.
Statement of Genuine Disputes of Material Fact in Opposition to Shah and Serve Global's Motion for Partial Summary Judgment, filed Oct. 3, 2014, in *Mophie, Inc.* v. *Source Vista*, Case No. 8:13-CV-01321 in the United States District Court for the Central District of California.
Opposition of LivingSocial to Mophie's Motion for Summary Judgment, dated Oct. 3, 2014, in *Mophie, Inc.* v. *Source Vista*, Case No. 8:13-CV-01321 in the United States District Court for the Central District of California.
Defendants' Opposition to Plaintiff's Motion for Summary Judgment, filed Oct. 3, 2014, in *Mophie, Inc.* v. *Source Vista*, Case No. 8:13-CV-01321 in the United States District Court for the Central District of California.
Defendants' Response to Plaintiffs Statement of Uncontroverted Material Fact and Contentions of Law, filed Oct. 3, 2014, in *Mophie, Inc.* v. *Source Vista*, Case No. 8:13-CV-01321 in the United States District Court for the Central District of California.
David Munson Deposition Transcript, dated Sep. 29, 2014, in *Mophie, Inc.* v. *Source Vista*, Case No. 8:13-CV-01321 in the United States District Court for the Central District of California.
Declaration of John Feland, Ph.D. In Support of Mophie's Opposition to Defendants Motion for Partial Summary Judgment, filed Oct. 3, 2014, in *Mophie, Inc.* v. *Source Vista*, Case No. 8:13-CV-01321 in the United States District Court for the Central District of California.
LivingSocial's Reply in Support of Motion for Summary Judgment, Filed Oct. 10, 2014, in *Mophie, Inc.* v. *Source Vista*, Case No. 8:13-CV-01321 in the United States District Court for the Central District of California.
Defendants' Reply in Support of Motion for Partial Summary Judgment, Filed Oct. 10, 2014, in *Mophie, Inc.* v. *Source Vista*, Case No. 8:13-CV-01321 in the United States District Court for the Central District of California.
Reply in Support of Mophie's Motion for Summary Judgment, Filed Oct. 10, 2014, in *Mophie, Inc.* v. *Source Vista*, Case No. 8:13-CV-01321 in the United States District Court for the Central District of California.

Mophie's Reply to Counterclaims of LivingSocial, filed Oct. 14, 2014, in *Mophie, Inc.* v. *Source Vista*, Case No. 8:13-CV-01321 in the United States District Court for the Central District of California.
Mophie's Reply to Counterclaims of Shah, filed Oct. 14, 2014, in *Mophie, Inc.* v. *Source Vista*, Case No. 8:13-CV-01321 in the United States District Court for the Central District of California.
Order Re LivingSocial's Motion for Summary Judgment, Mophie's Motion for Summary Judgment, Source Vista and Shah's Motion for Partial Summary Judgment, and Mophie's Motion to Bifurcate, dated Nov. 12, 2014, in *Mophie, Inc.* v. *Source Vista*, Case No. 8:13-CV-01321 in the United States District Court for the Central District of California.
Mophie's Memorandum in Support of its Motion for Reconsideration, filed Nov. 19, 2014, in *Mophie, Inc.* v. *Source Vista*, Case No. 8:13-CV-01321 in the United States District Court for the Central District of California.
Declaration of Sheila N. Swaroop in Support of Mophie's Motion for Reconsideration, filed Nov. 19, 2014, in *Mophie, Inc.* v. *Source Vista*, Case No. 8:13-CV-01321 in the United States District Court for the Central District of California.
Order Denying Plantiff's Motion for Reconsideration, dated Nov. 21, 2014, in *Mophie, Inc.* v. *Source Vista*, Case No. 8:13-CV-01321 in the United States District Court for the Central District of California.
Defendant's Response to Mophie's Fourth Set of Interrogatories, dated Sep. 23, 2014, in *Mophie, Inc.* v. *UNU Electronics Inc.*, Case No. 8:13-CV-01705 in the United States District Court for the Central District of California.
Plaintiff Mophie's Preliminary Claim Constructions and Identification of Extrinsic Evidence, dated Oct. 14, 2014, in *Mophie, Inc.* v. *UNU Electronics Inc.*, Case No. 8:13-CV-01705 in the United States District Court for the Central District of California.
Defendant's Preliminary Claim Constructions and Extrinsic Evicence, dated Oct. 14, 2014, in *Mophie, Inc.* v. *UNU Electronics Inc.*, Case No. 8:13-CV-01705 in the United States District Court for the Central District of California.
Plaintiff Mophie's Opening Brief on Claim Construction, filed Oct. 29, 2014, in *Mophie, Inc.* v. *UNU Electronics Inc.*, Case No. 8:13-CV-01705 in the United States District Court for the Central District of California.
Declaration of John Feland, Ph.D. In Support of Plaintiffs Preliminary Claim Constructions, filed Oct. 29, 2014, in *Mophie, Inc.* v. *UNU Electronics Inc.*, Case No. 8:13-Cv-01705 in the United States District Court for the Central District of California.
Supplemental Declaration of John Feland, Ph.D. in Support of Plaintiffs Claim Constructions, filed Oct. 29, 2014, in *Mophie, Inc.* v. *UNU Electronics Inc.*, Case No. 8:13-CV-01705 in the United States District Court for the Central District of California.
Declaration of Sheila N. Swaroop in Support of Mophie's Opening Claim Construction Brief, filed Oct. 29, 2014, in *Mophie, Inc.* v. *UNU Electronics Inc.*, Case No. 8:13-CV-01705 in the United States District Court for the Central District of California.
Transcript of Deposition of John Feland, dated Oct. 21, 2014, in *Mophie, Inc.* v. *UNU Electronics Inc.*, Case No. 8:13-CV-01705 in the United States District Court for the Central District of California.
Defendant's Opening Claim Construction Brief, dated Oct. 29, 2014, in *Mophie, Inc.* v. *UNU Electronics Inc.*, Case No. 8:13-CV-01705 in the United States District Court for the Central District of California.
Corrected Request for Ex Parte Reexamination of U.S. Patent No. 8,367,235, filed Sep. 18, 2014.
Order Granting Request for Ex Parte Reexamination of U.S. Patent No. 8,367,235, in Reexamination Control No. 90/013,319, dated Oct. 24, 2014.

* cited by examiner

BATTERY PACK, HOLSTER, AND EXTENDIBLE PROCESSING AND INTERFACE PLATFORM FOR MOBILE DEVICES

CROSS REFERENCE TO RELATED APPLICATIONS

This application is a divisional application of U.S. application Ser. No. 12/357,262, filed Jan. 21, 2009, which claims priority to U.S. provisional application Ser. No. 61/021,897, entitled "Battery Pack and Holster for Mobile Devices" filed Jan. 18, 2008, the disclosures of which are hereby expressly incorporated by reference for all purposes.

FIELD

One embodiment relates to battery packs and/or holsters and, more particular, to an external battery pack and/or holster for mobile electronic devices.

BACKGROUND

Many mobile devices (e.g., mobile phones, digital assistants, mobile communication devices, handheld computing devices, personal music/video/content players and storage devices) are often powered by battery power sources. Such battery power sources are often housed within the mobile device and may be changed and/or recharged as needed. However, as inure powerful mobile devices are designed, these tend to consume power more quickly, thereby shortening the time between charges. This tends to limit the usefulness of the mobile device since the user must find a power source to recharge the battery source and wait until it is recharged.

Additionally, after a certain number of recharges, a battery source may need to be replaced as it may no longer hold a charge. Oftentimes, it is not easy to replace a battery source as the mobile device may need to be disassembled or opened to reach the battery source.

Therefore, a way is needed to extend the time between charges of mobile devices and/or continue to power the mobile device even after an internal power source has been depleted.

SUMMARY

According to one embodiment, a battery pack for a mobile communication device is provided comprising a casing and one or more rechargeable power cells. The casing may define a cavity that conforms, at least partially, to the outer shape of the mobile communication device. Additionally, the casing may further define one or more access openings to permit access to integrated interfaces (e.g., power button, camera lens, audio jack, etc.) of the mobile communication device.

The one or more rechargeable power cells may be housed within the thickness of the casing. For example, the power cells may be housed within the thickness of a back plane of the casing. The casing may secure the mobile communication device within the cavity while at least one surface of the mobile communication device remains exposed.

The battery pack may also include an internal interface and/or external interface. The internal interface may engage a corresponding interface on the mobile communication device to provide power from the one or more rechargeable cells to the mobile communication device. The external interface may be electrically coupled to the internal interface in order to transmit signals from the mobile communication device to an external device. The external interface may further serve to recharge the one or more rechargeable power cells.

The battery pack may further comprise a recharging device integrated within the battery pack that wirelessly recharges the one or more rechargeable power cells. This may include an inductive electrical recharging system that requires no direct contact or can recharge at a distance.

According to one aspect, the battery pack may also include additional communication interfaces and/or processors. For instance, a plurality of communication interfaces may be coupled to the internal interface, wherein the mobile communication device can transmit and receive signals via the communication interfaces. Likewise, at least one processor within the battery pack may be coupled to the internal interface and adapted to collect information via one or more interfaces of the battery pack and provide the collected information to the mobile communication device. In one example, the at least one processor may be adapted to execute one or more instructions under the control of the mobile communication device.

The battery pack may also include a display interface integrated into the battery pack to display information to a user. Such display interface may allow expanding the display from the mobile communication device to the display interface.

According to one aspect, the thickness of the battery pack may be approximately or substantially the same as the thickness of the mobile communication device. For this purpose, the battery pack may be slim and/or have an ergonomic shape so that it does not significantly increase the thickness and/or size of the mobile communication device. Consequently, mobile communication device can be used within the battery pack for extended periods of time since the battery pack does not significantly increase the bulkiness of the mobile communication device.

According to one embodiment, a battery pack for a mobile device is provided, comprising: a back plane, a first and second sides, a bottom side, and one or more battery cells housed within the thickness of the back plane. The back plane and first, second and bottom sides may define a cavity for mounting the mobile device. The one or more battery cells may be rechargeable while a mobile device is mounted within the cavity. The battery pack may also include an internal interface that electrically couples the one or more battery cells to the mobile device.

Additionally, the battery pack may include one or more speakers housed within the thickness of the hack plane. The speakers may be electrically coupled to an interface to allow a mobile device mounted in the cavity to send audio signals through the one or more speakers. Similarly, the battery pack may include one or more microphones housed within the thickness of the back plane and electrically coupled to an interface to allow a mobile device mounted in the cavity to receive audio signals from the one or more microphones.

According to yet another aspect, the battery pack may include a plurality of communication interfaces coupled to the internal interface, wherein the mobile communication device can transmit and receive signals via the communication interfaces. The battery pack may also include at least one processor coupled to the internal interface and adapted to collect information via one or more of the plurality of communication interfaces and provide the collected information to the mobile communication device.

The thickness of the battery pack may be less than twice the thickness of the mobile communication device.

According to yet another feature a battery pack is provided comprising: (a) a holster defining a cavity that conforms, at least partially, to the outer shape of the mobile communication device; (b) one or more rechargeable power cells; and/or (c) an electrical connector to provide power from the one or more rechargeable power cells to the mobile communication device.

DETAILED DESCRIPTION OF THE INVENTION

In the following detailed description of the invention, numerous specific details are set forth in order to provide a thorough understanding of the invention. However, the invention may be practiced without these specific details. In other instances, well known methods, procedures, and/or components have not been described in detail so as not to unnecessarily obscure aspects of the invention.

Various embodiments provide battery packs shaped to conform to the external shape of a mobile device, thereby providing a permanent or long-term replacement power source without significantly affecting the size and usability of the mobile device.

According to one feature, the battery pack may provide recharge power to the mobile device while also providing an external signaling and/or charging interface to the mobile device. This way, the mobile device need not be removed from the battery pack in order to charge it or provide data (e.g., synchronization, etc.).

According to yet another feature, the battery pack may include one or more different types of communication interfaces to extend the communication capabilities of the mobile device. This allows the mobile device to communicate via other interfaces that may not be built into the mobile device.

According to yet another feature, the battery pack may include one or more processors to extend the processing capabilities of the battery pack. For instance, the one or more processors may increase the processing capabilities of the battery pack and/or provide purpose-specific processors. That is, the interface between the battery pack and mobile device may allow the mobile device to use the one or more processors to execute application on the battery pack. Now that such applications may, in some instances, continue to operate even if the mobile device is detached from the battery pack.

According to yet another feature, the battery pack may include and inductive recharging device or a near-distance recharging device so that its power cells may be recharged without actually physically plugging it to a recharge power source.

First Embodiment of Battery Pack

Figure 1:
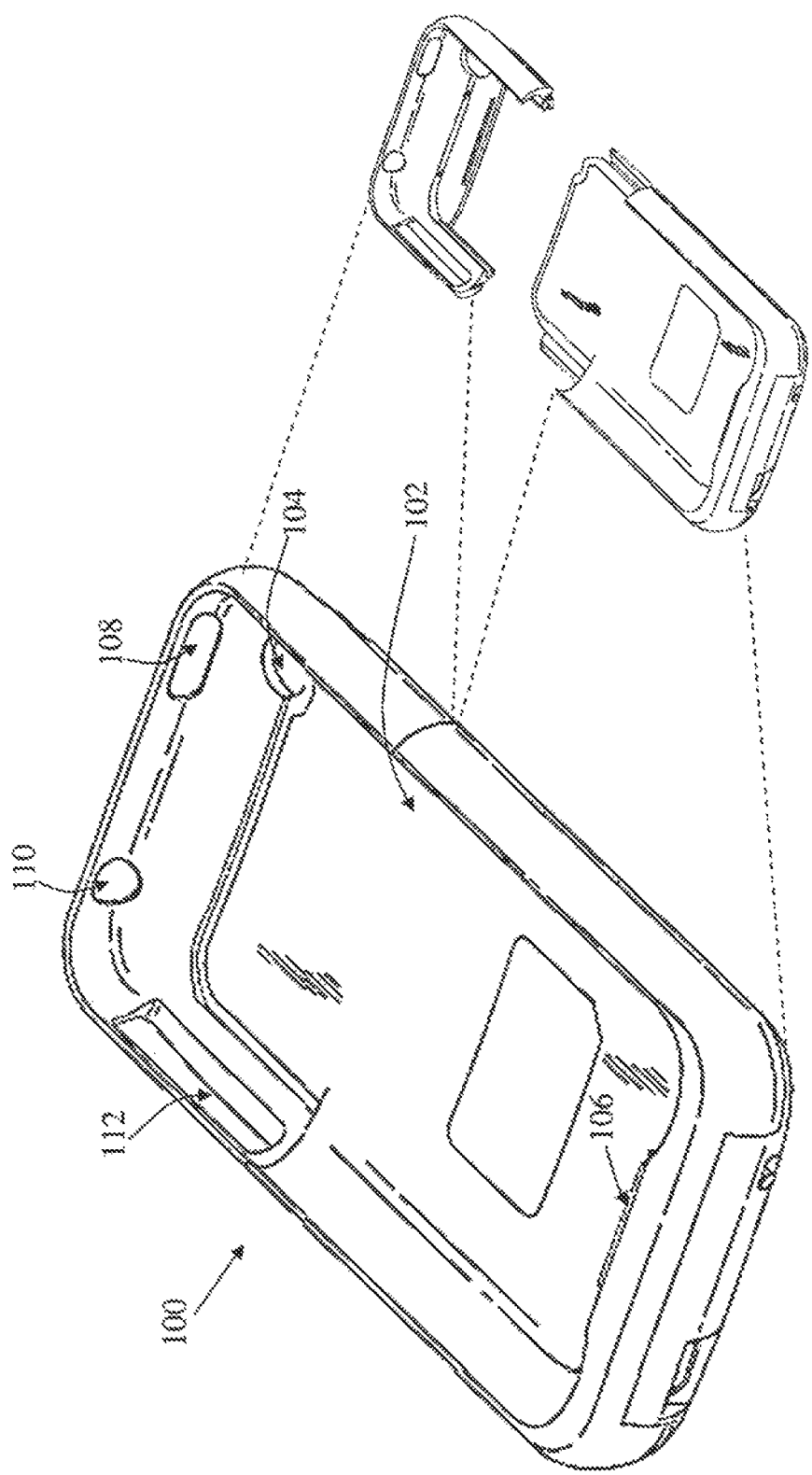
FIG. 1 illustrates a perspective view of a battery pack for a mobile device according to one example.

FIG. 1 illustrates a perspective view of a battery pack for a mobile device according to one example. In this example, the battery pack 100 is shaped to receive or house a mobile phone within a contoured cavity 102. The battery pack 100 has an integrated rechargeable power cell capable of providing power to operate and/or recharge a mobile device (e.g., iPhone™ by Apple Inc., etc.).

Figure 2:
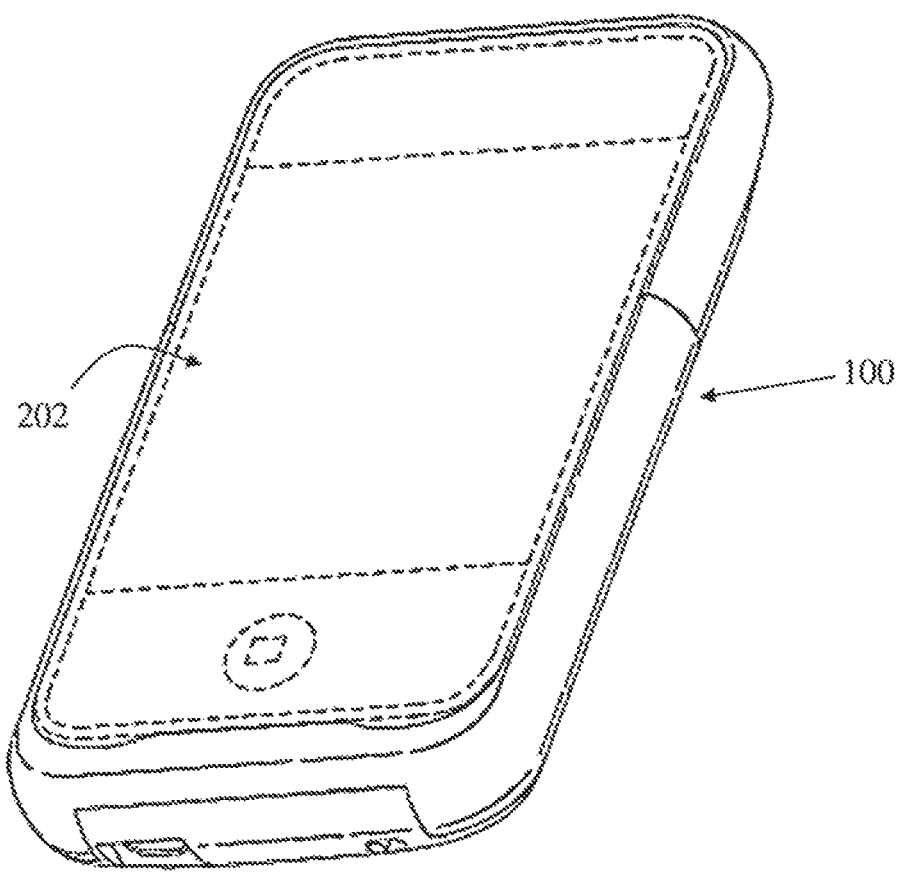
FIG. 2 illustrates how a mobile device can be housed within the battery pack of FIG. 1.

FIG. 2 illustrates how a mobile device can be housed within the battery pack 100 of FIG. 1. As can be appreciated from this figure, the battery pack 100 is shaped to closely wrap around the mobile device 202 and serves as a protective case for the mobile device 100.

Figure 3:
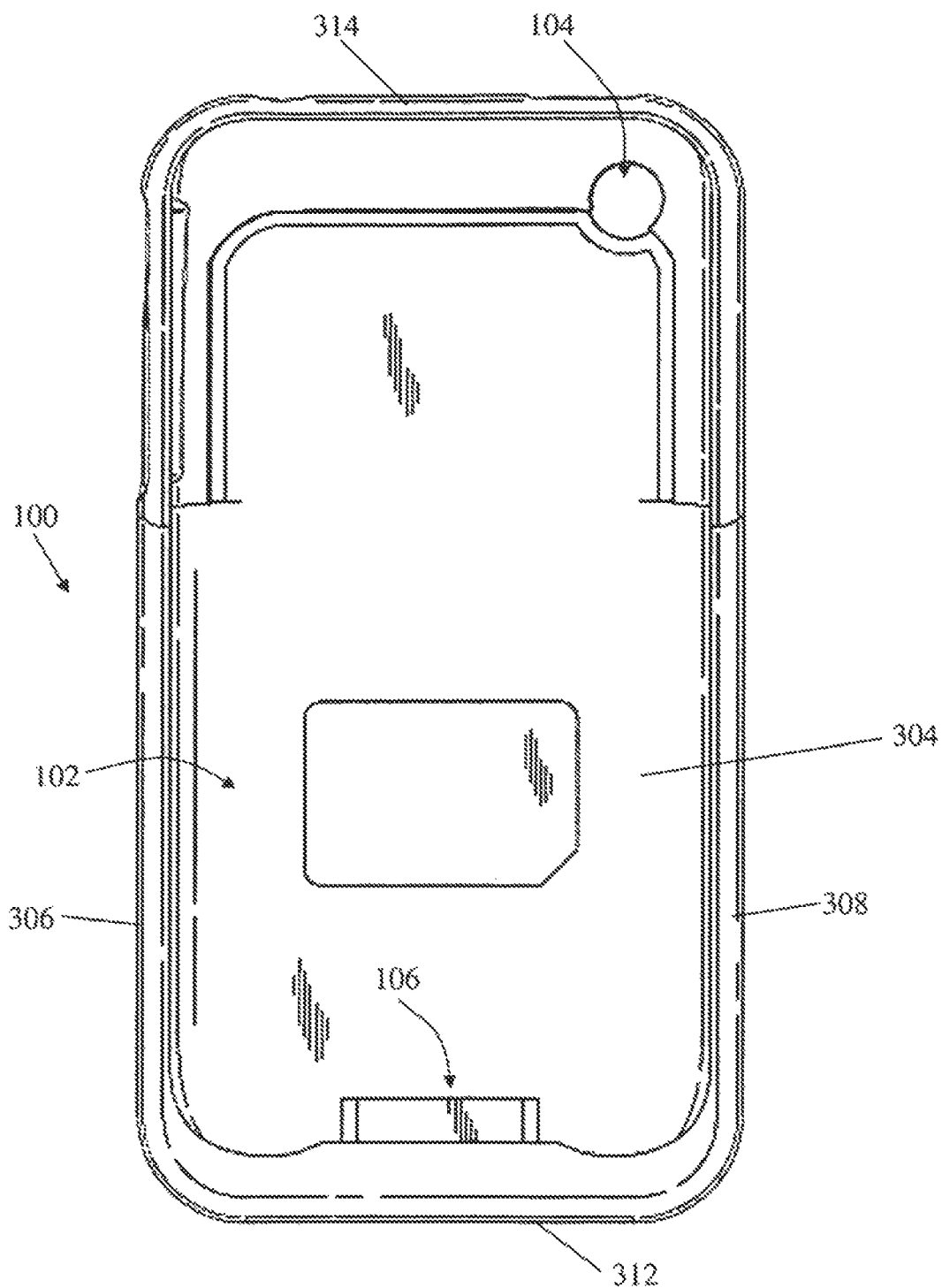
FIG. 3 illustrates a front view of the battery pack of FIG. 1.

FIG. 3 illustrates a front view of the battery pack 100 of FIG. 1. The battery pack 100 includes a hack plane 304, first and second sides 306 and 308, a bottom side 312, and a top side 314. The hack plane 304, first and second sides 306, bottom side 312 and top side 314 may be shaped to form a pocket or cavity 102 in which a mobile device to be powered can be housed. The top side 314 of the battery pack 100 may slide out to allow insertion and removal of the mobile device.

Referring again to FIG. 1, the battery pack 100 may include one or more openings 104, 108, 110, and 112 to facilitate access to various features of the mobile phone. For instance, a first opening 104 on the back plane 304 of the battery pack 100 may allow unobstructed view for a camera lens on the hack of the mobile device. A second Opening 108 may provide access to a screen on/off switch for the mobile device. A third opening 110 may provide access to an audio jack on the mobile device. A fourth opening 112 on the first side 306 may provide access to a volume control sliding switch.

The battery pack 100 may also include a connector or interface 106 within the cavity 102 (e.g., on the bottom side 312) through which power can be provided to the mobile device from the internal power cell of the battery pack 100. Additionally, the connector 106 may be coupled to an external interface to provide input and/or output signals to the mobile device.

From FIG. 1, it can be appreciated that the battery pack may include two sections that separate to allow insertion of the mobile device and can then be coupled together to secure the mobile device in place. The size and shape of the battery pack 100 may be approximately that of the external contour of a mobile device to which it is intended to provide power.

Figure 4:
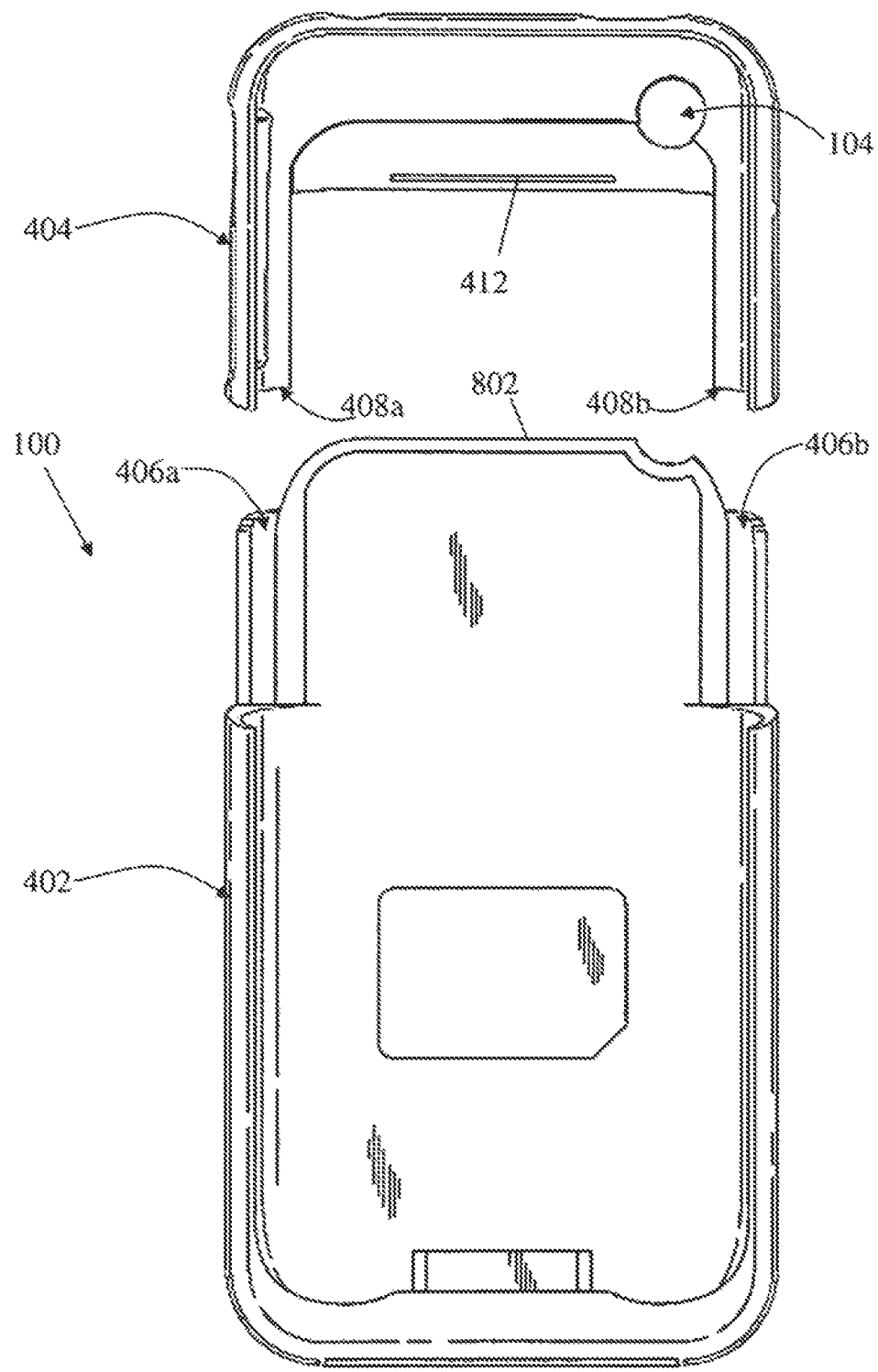
FIG. 4 illustrates the battery pack of FIG. 1 in an open configuration.

FIG. 4 illustrates the battery pack of FIG. 1 in an open configuration. The battery pack 100 may include a bottom section 402 and a top section 404 that can be separated from each other to insert a mobile device within the battery pack 100 and can them be coupled together secure the mobile device in place. For example, the bottom section 402 may include receiving grooves 406a and 406b that receive rails 408a and 408b from the top section 404. In this manner, the top section 404 can be coupled to the bottom section 402 by pressure fit. For example, a tongue section 802 (FIG. 8) may slide on to the top section 404 such that an engaging tab 412 couples into a receiving groove 804 (FIG. 8) to secure the top section 404 to the bottom section 402.

Figure 5:
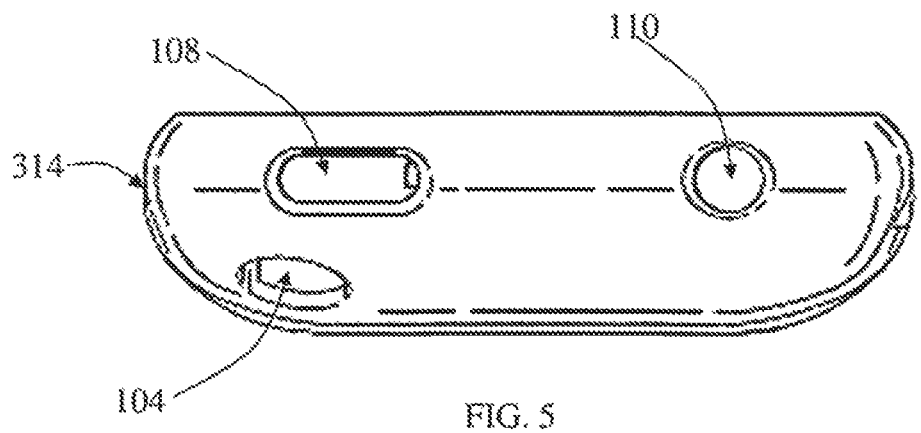
FIG. 5 illustrates a top view of the battery pack of FIG. 1.

FIG. 5 illustrates a top view of the battery pack 100 of FIG. 1. In this view, the top side 314 of the battery pack 100 is shown and the first opening 104, second opening 108, and third opening 110 can be appreciated.

Figure 6:
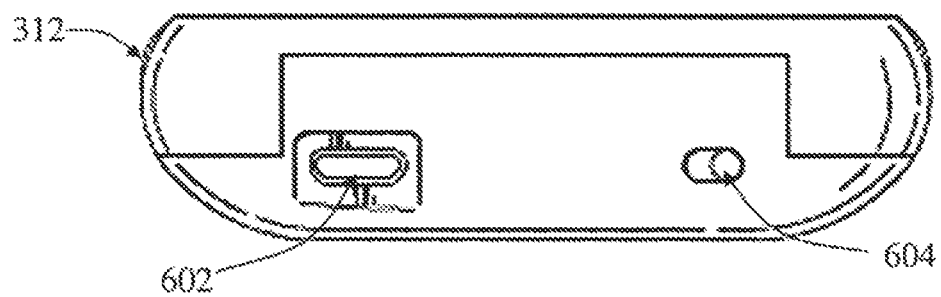
FIG. 6 illustrates a bottom view of the battery pack of FIG. 1.

FIG. 6 illustrates a bottom view of the battery pack 100 of FIG. 1. In this view, the bottom side 312 of the battery pack 100 is shown. In this view, an external interface 602 (e.g., micro USB connector) is shown. This external interface 602 may serve to recharge the internal power cell of the battery pack. Additionally, the external interface 602 may also provide a pass-through signaling interface for the internal connector or interface 106, thereby allowing the mobile device to communicate via the external interface 602. A switch 604 may also be located on the bottom side 312 of the battery pack and can function to switch power from the battery pack On or Off. That is, when the mobile device has sufficient power on its own, the power cell of the battery pack is not needed and can be switched Off until it is needed.

Figure 7:
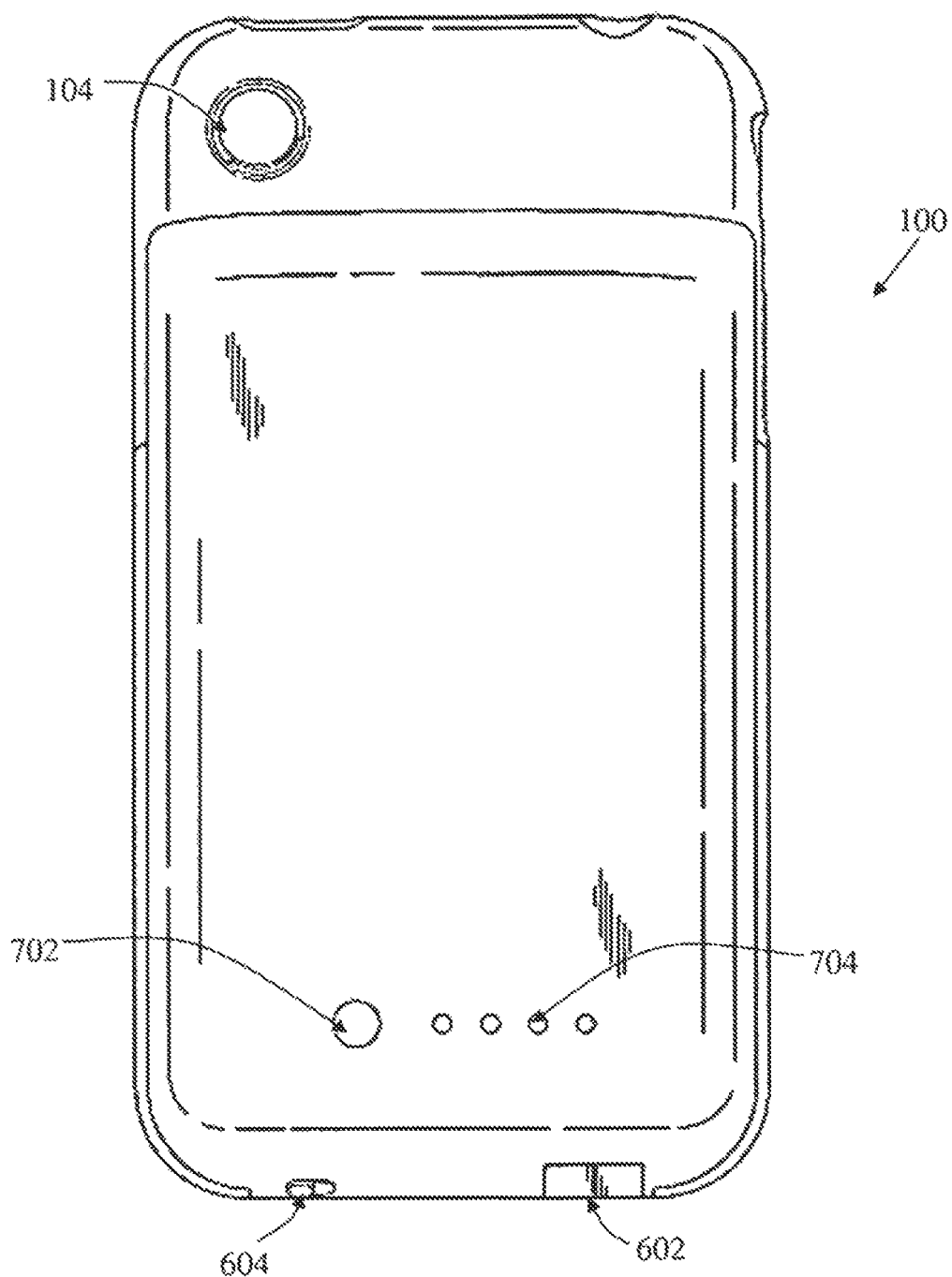
FIG. 7 illustrates a back view of the battery pack of FIG. 1.

FIG. 7 illustrates a hack view of the battery pack 100 of FIG. 1. In this example, a test button 702 is provided that, when pushed, causes plurality of LED lights 704 to indicate the power or charge level of the internal power cell of the battery pack 100.

Figure 8:
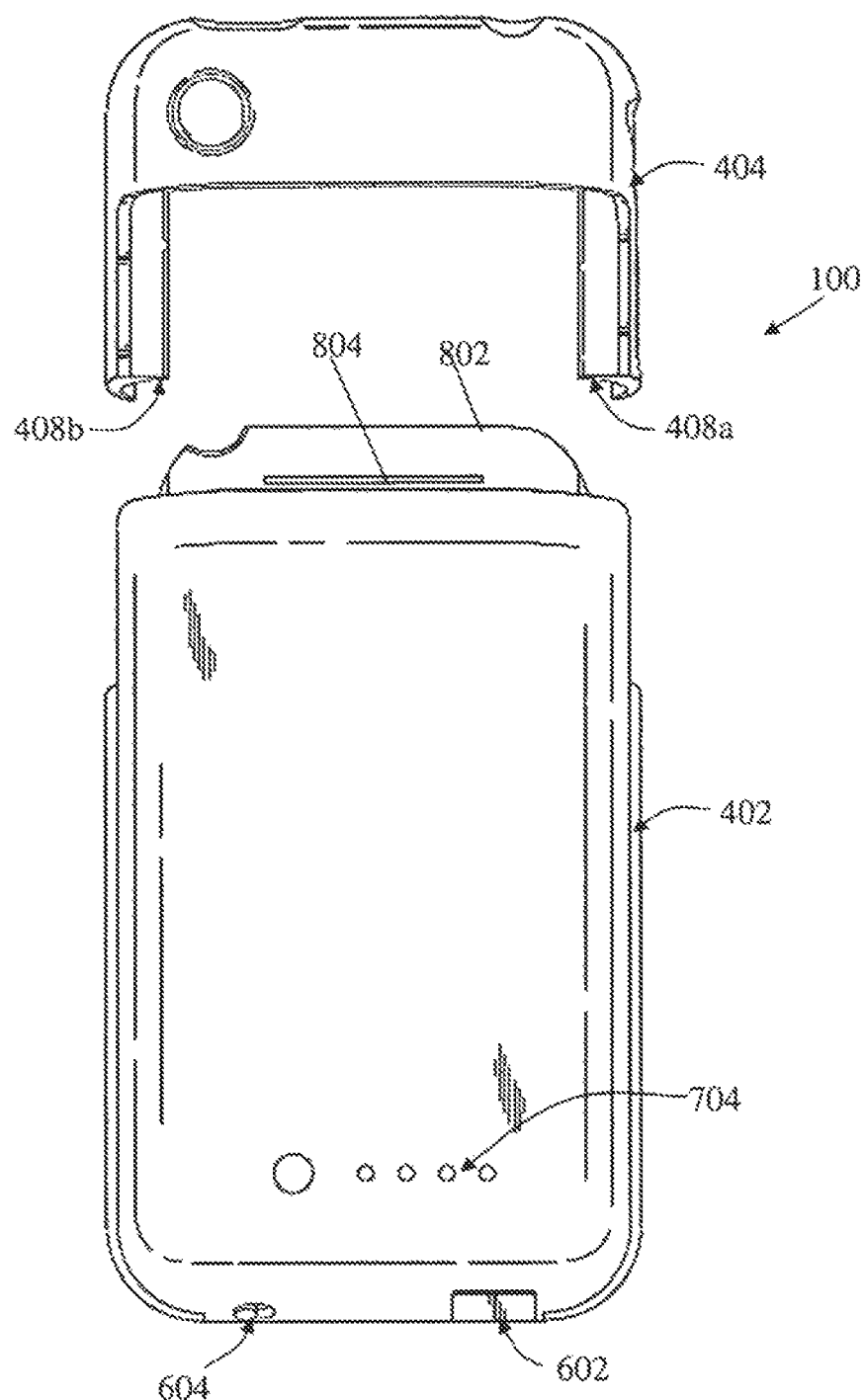
FIG. 8 illustrates back view of the battery pack of FIG. 1 in an open position.

FIG. 8 illustrates hack view of the battery pack 100 of FIG. 1 in an open position.

Figure 9:
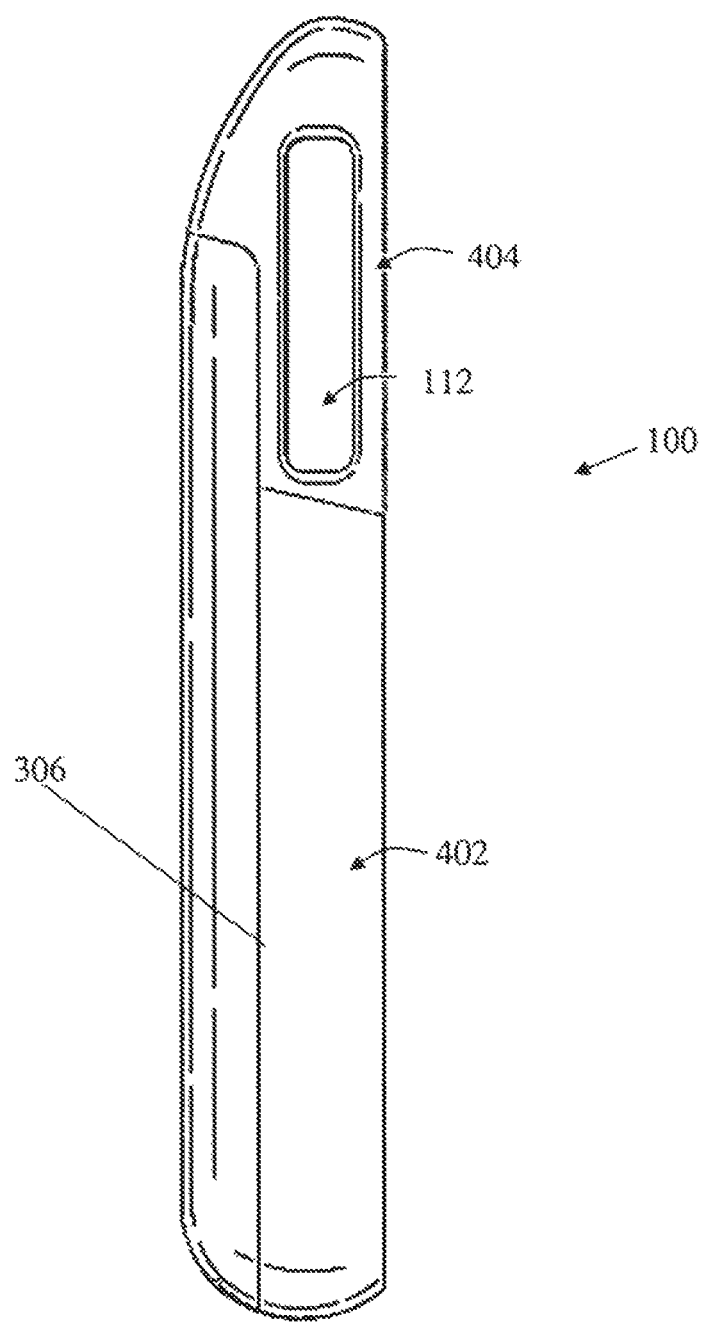
FIG. 9 illustrates a first side view of the battery pack of FIG. 1.

FIG. 9 illustrates a first side view of the battery pack of FIG. 1.

Figure 10:
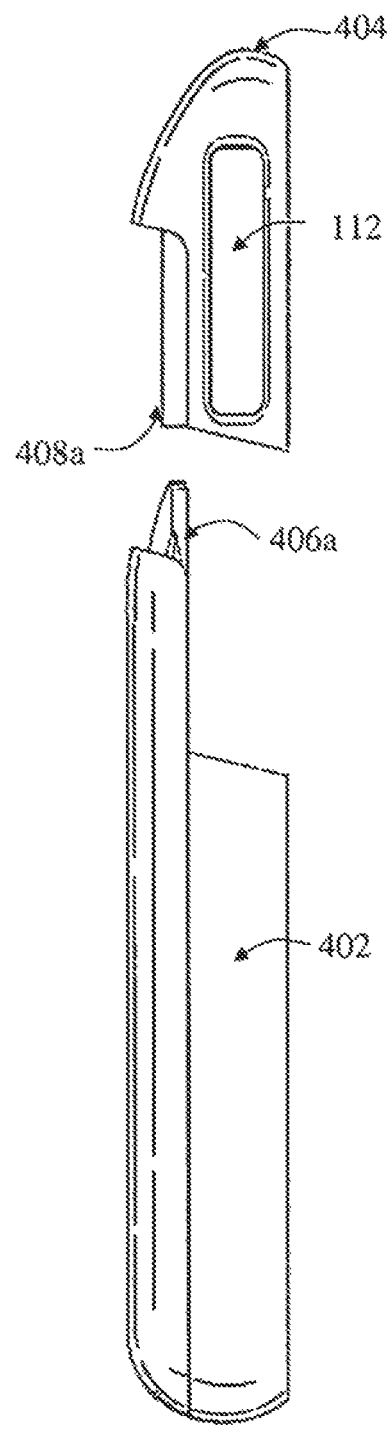
FIG. 10 illustrates the first side view of the battery pack of FIG. 1 in an open position.

FIG. 10 illustrates the first side view of the battery pack of FIG. 1 in an open position.

Figure 11:
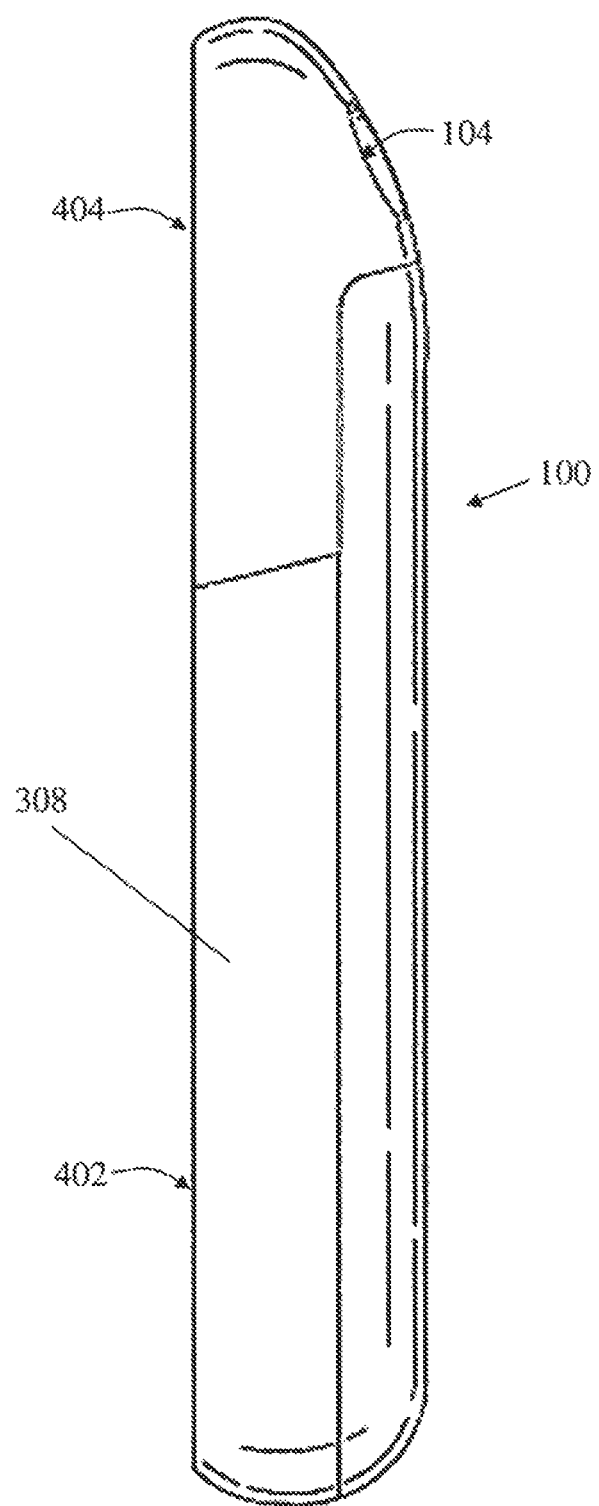
FIG. 11 illustrates a second side view of the battery pack of FIG. 1.

FIG. 11 illustrates a second side view of the battery pack of FIG. 1.

Figure 12:
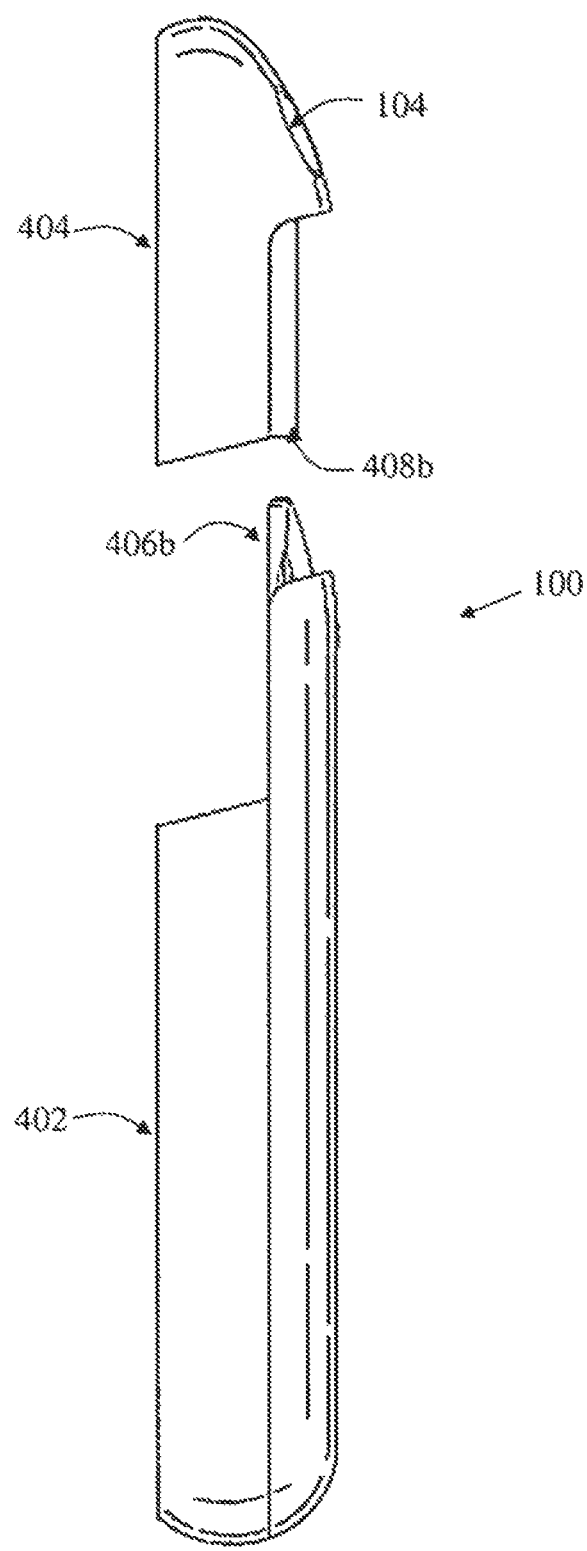
FIG. 12 illustrates the second side view of the battery pack of FIG. 1 in an open position.

FIG. 12 illustrates the second side view of the battery pack of FIG. 1 in an open position.

Figure 13:
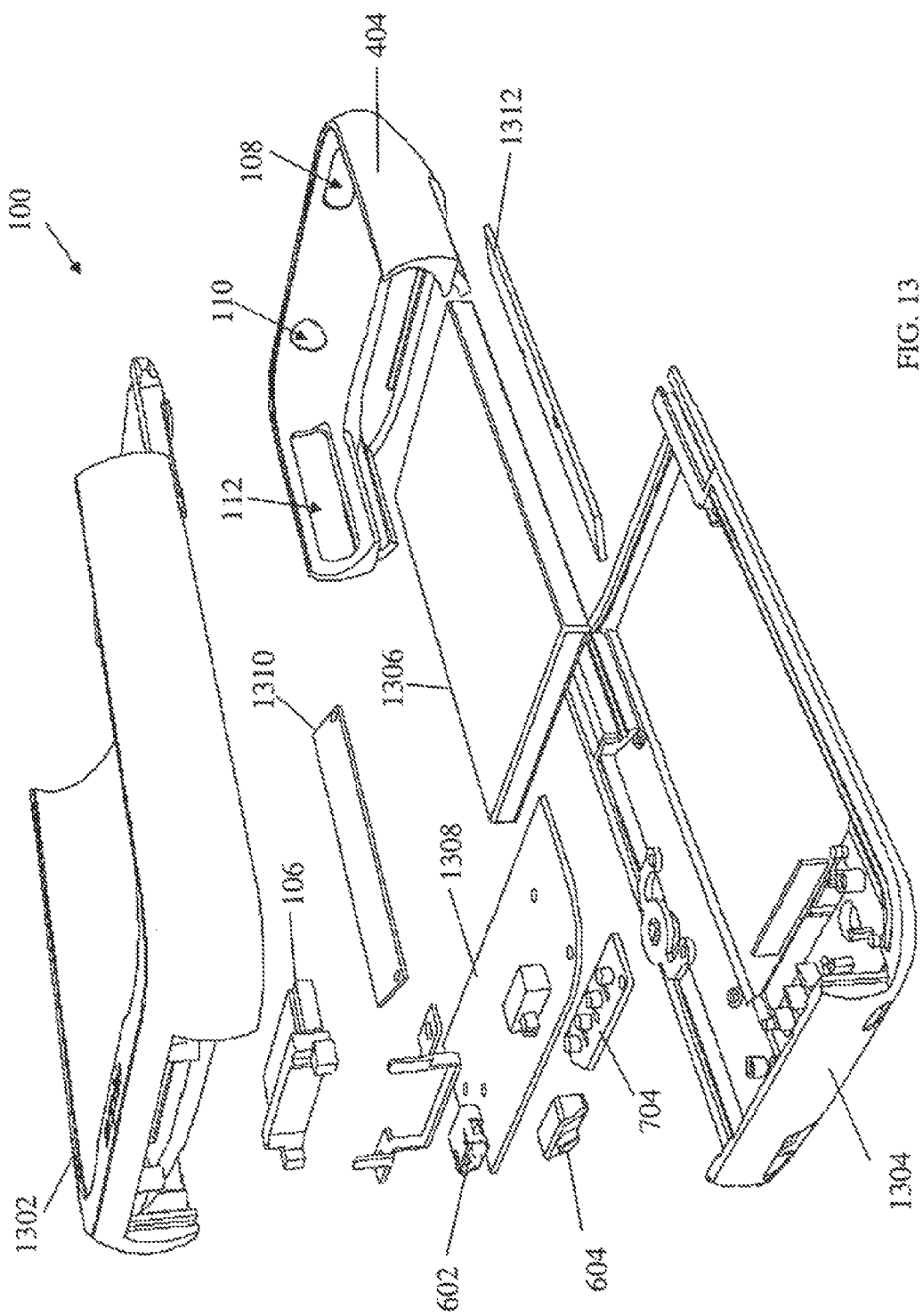
FIG. 13 is an exploded view of components of the battery pack of FIG. 1.

FIG. 13 is an exploded view of components of the battery pack of FIG. 1. In this example, the battery pack may include a first bottom section 1302 and a second bottom section 1304 which form a top and bottom shell in between which one or more circuit boards 1308, 1310, and/or 1312 and/or one or more power cells 1306 are housed. That is, the circuits hoards 1308, 1310, 1312 and/or power cell(s) 1306 are sandwiched between the top and bottom sections 1302 and 1304 of the battery pack 100. Consequently, the rechargeable power cell(s) 1306 may be housed within the thickness of the back plane of the battery pack.

In some instance, the circuit hoards and or power cell of the battery pack may cause interference with the antenna or signaling of the mobile device which is in close proximity. Consequently, one aspect provides for reducing the size of a primary circuit hoard 1308 by adding secondary circuit boards 1310 and 1312 which are electrically coupled to the primary circuit hoard 1308. This allows reducing the size of the circuit board 1308 thereby reducing interference to the antenna of the mobile device. Additionally, the ground for the power cell 1306 may be coupled to the ground for the mobile device (via the internal interface 106) to reduce interference to the mobile device.

Figure 14:
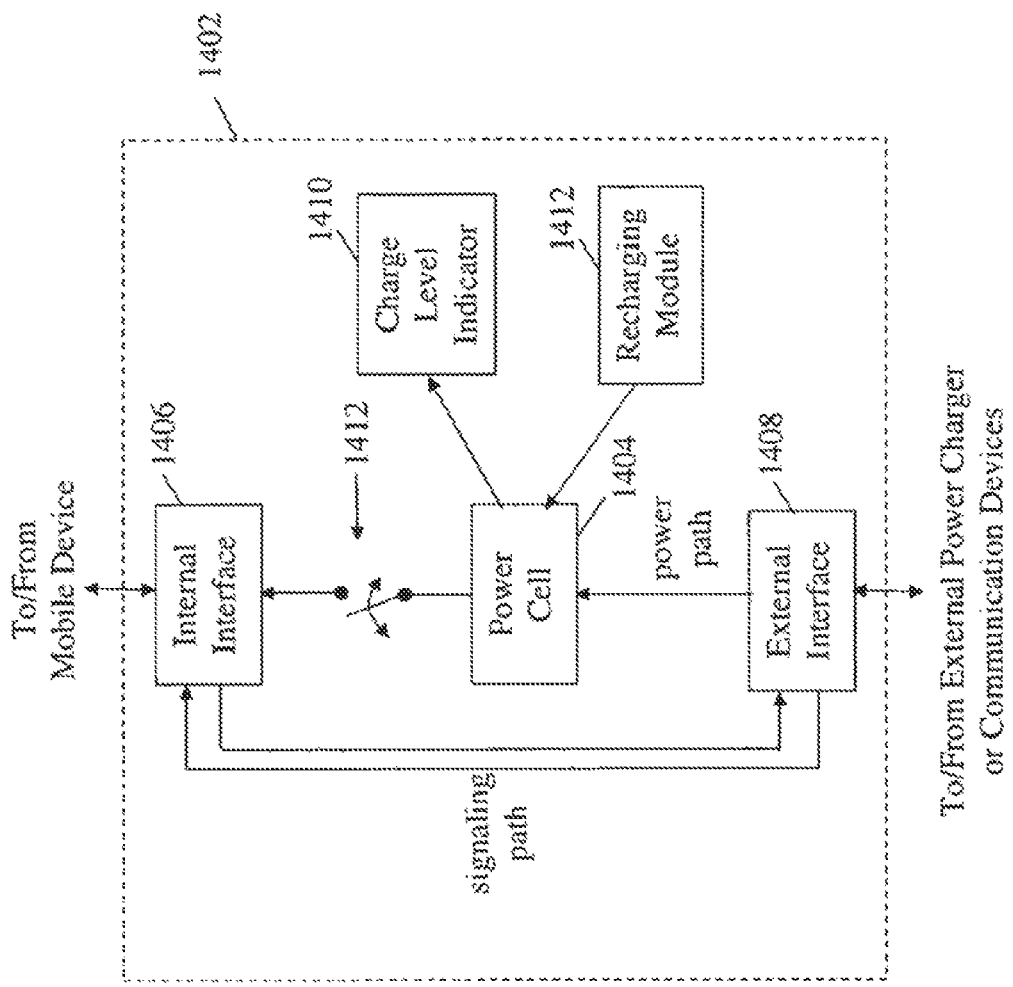
FIG. 14 illustrates a block diagram for the battery pack of FIG. 1.

FIG. 14 illustrates a block diagram for the battery pack 100 of FIG. 1. The battery pack 1402 may include a power cell 1404, an internal interface 1406, an external interface 1408, and charge level indicator 1410. The internal interface 1406 may be adapted to provide a mobile device power from the power cell 1404 as well as passing signal to/from the mobile device to the external interface 1408. The external interface 1408 may allow recharging of the power cell 1404 as well as passing signals to/from the mobile device via the internal interlace 1406. A switch 1412 may allow switching power from the power cell 1404 to the mobile device On and Off as desired. Also, a charge level indicator 1410 permits displaying of the charge level of the power cell 1404. Additionally, a recharging module 1412 serves to recharge to power cell 1404 when needed.

Second Embodiment of Battery Pack

FIGS. 15-16 and 18-22 illustrate yet another embodiment of the power pack. In this embodiment, the power pack may operate as previously disclosed but does not include a top section. By removing the top section, the battery pack is more compact in size and ergonomic so that it does not significantly increase or change the size, thickness, and/or shape of mobile communication device 1602 secured thereto.

Figure 15:
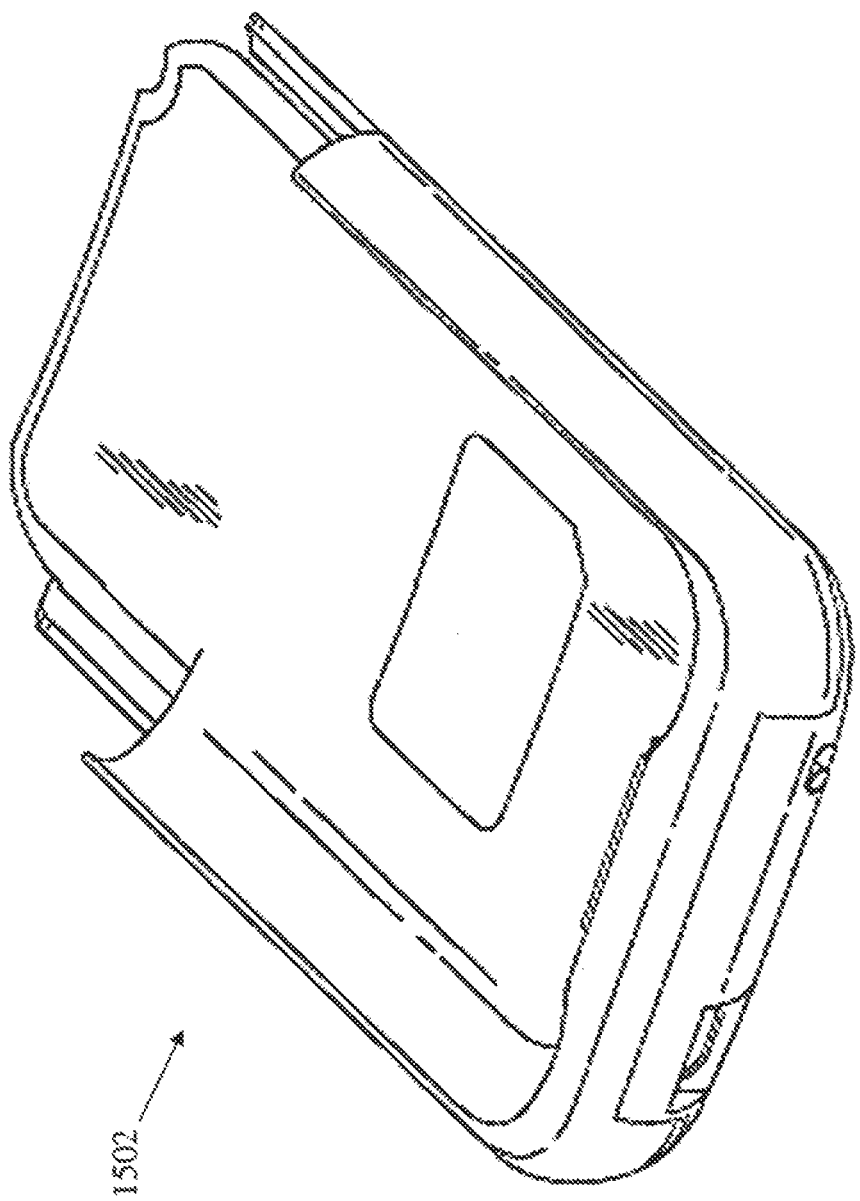
FIG. 15 illustrates a perspective view of the battery pack.

FIG. 15 illustrates a perspective view of the battery pack 1502.

Figure 16:
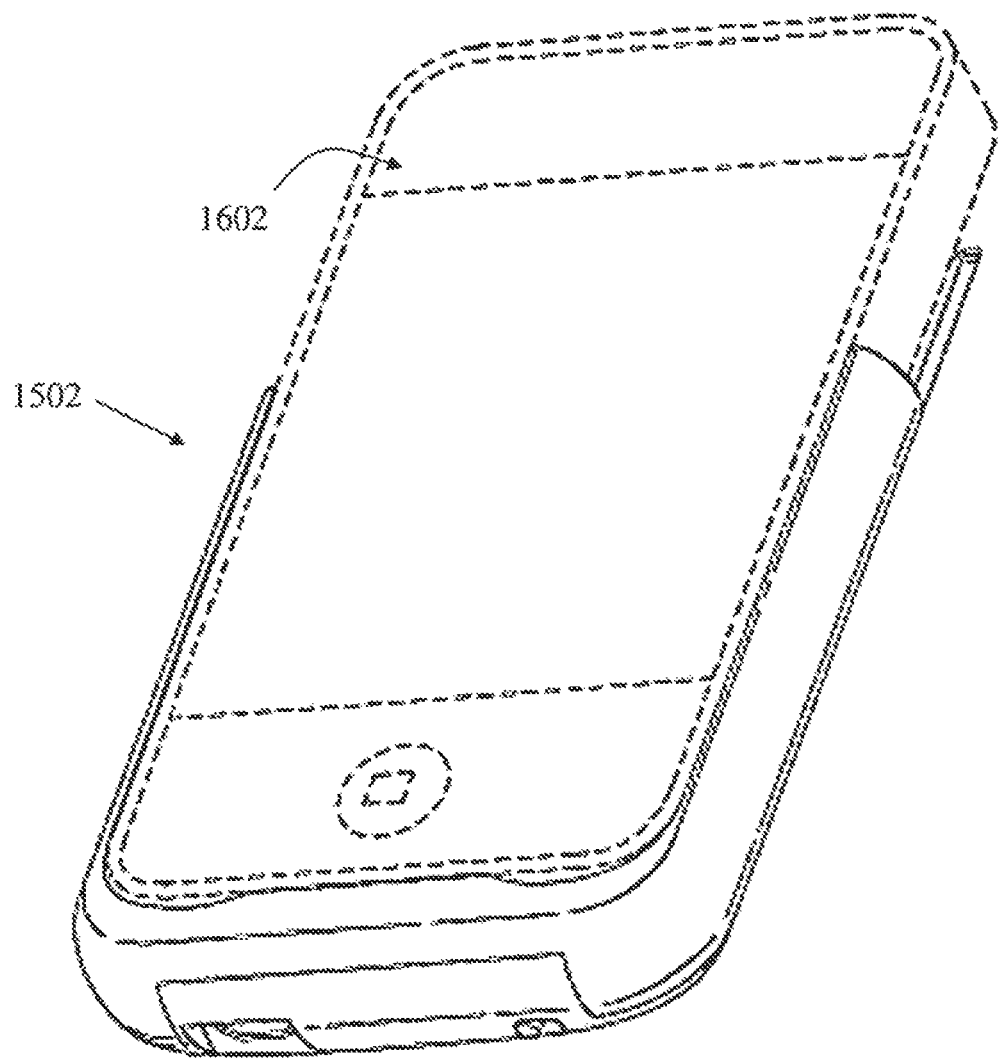
FIG. 16 illustrates a perspective view of the battery pack with a mobile device 1602 inserted therein.

FIG. 16 illustrates a perspective view of the battery pack 1502 with a mobile device 1602 inserted therein.

Figure 18:
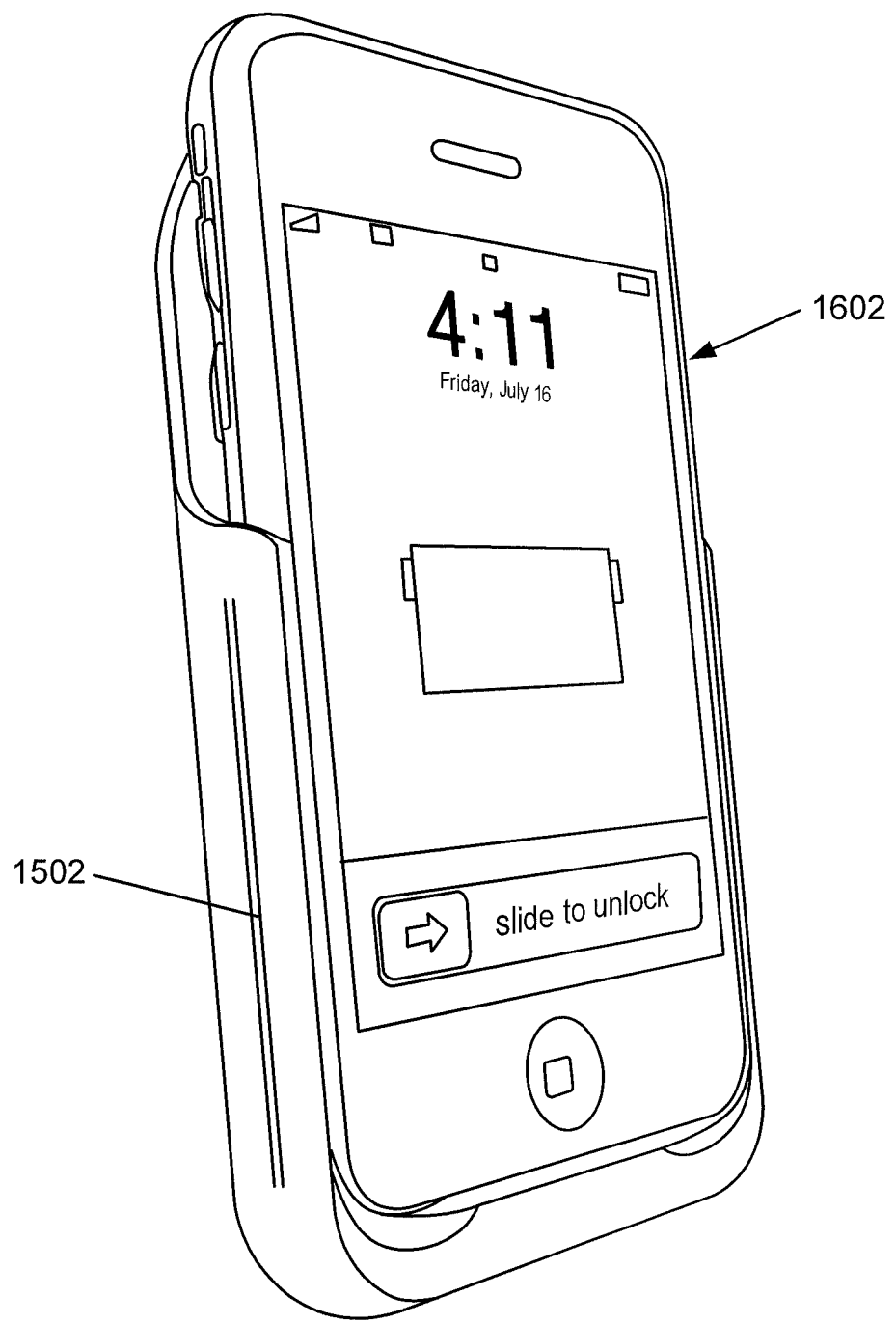
FIG. 18 illustrates another perspective view of the battery pack.

FIG. 18 illustrates another perspective view of the battery pack 1502.

Figure 19:
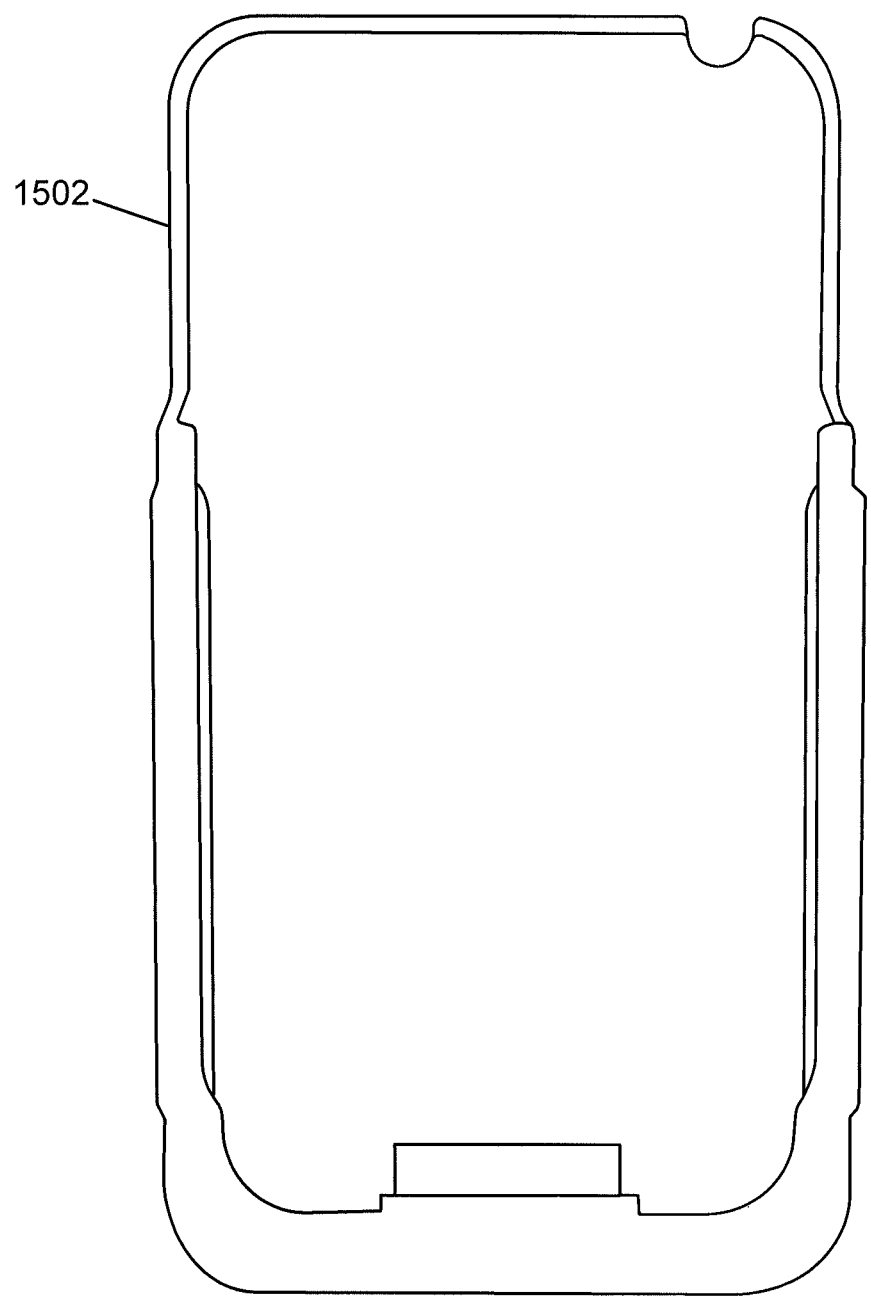
FIG. 19 illustrates a front view of the battery pack.

FIG. 19 illustrates a front view of the battery pack 1502.

Figure 20:
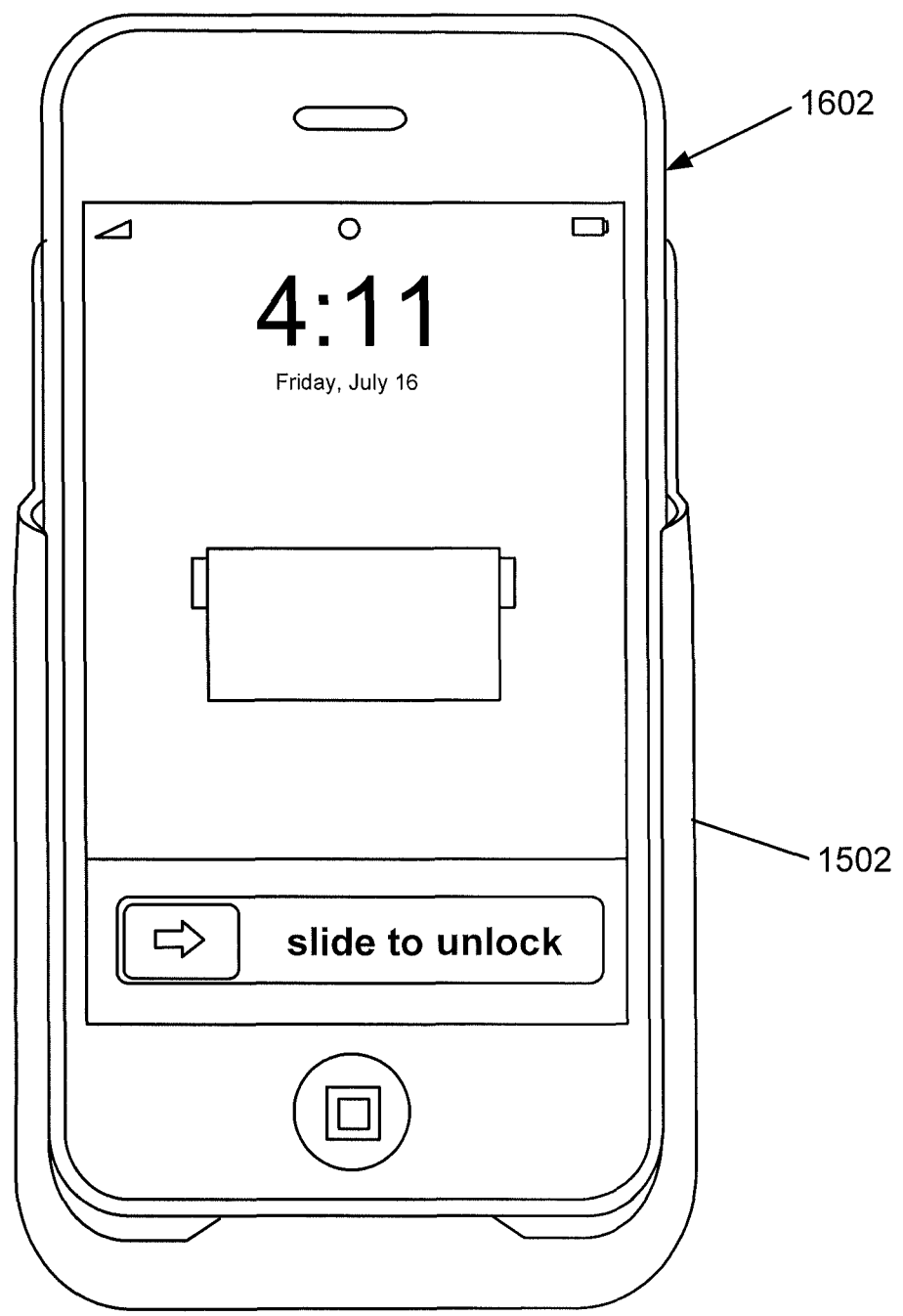
FIG. 20 illustrates a front view of the battery pack 1502 with the mobile device inserted therein.

FIG. 20 illustrates a front view of the battery pack 1502 with the mobile device inserted therein.

Figure 21:
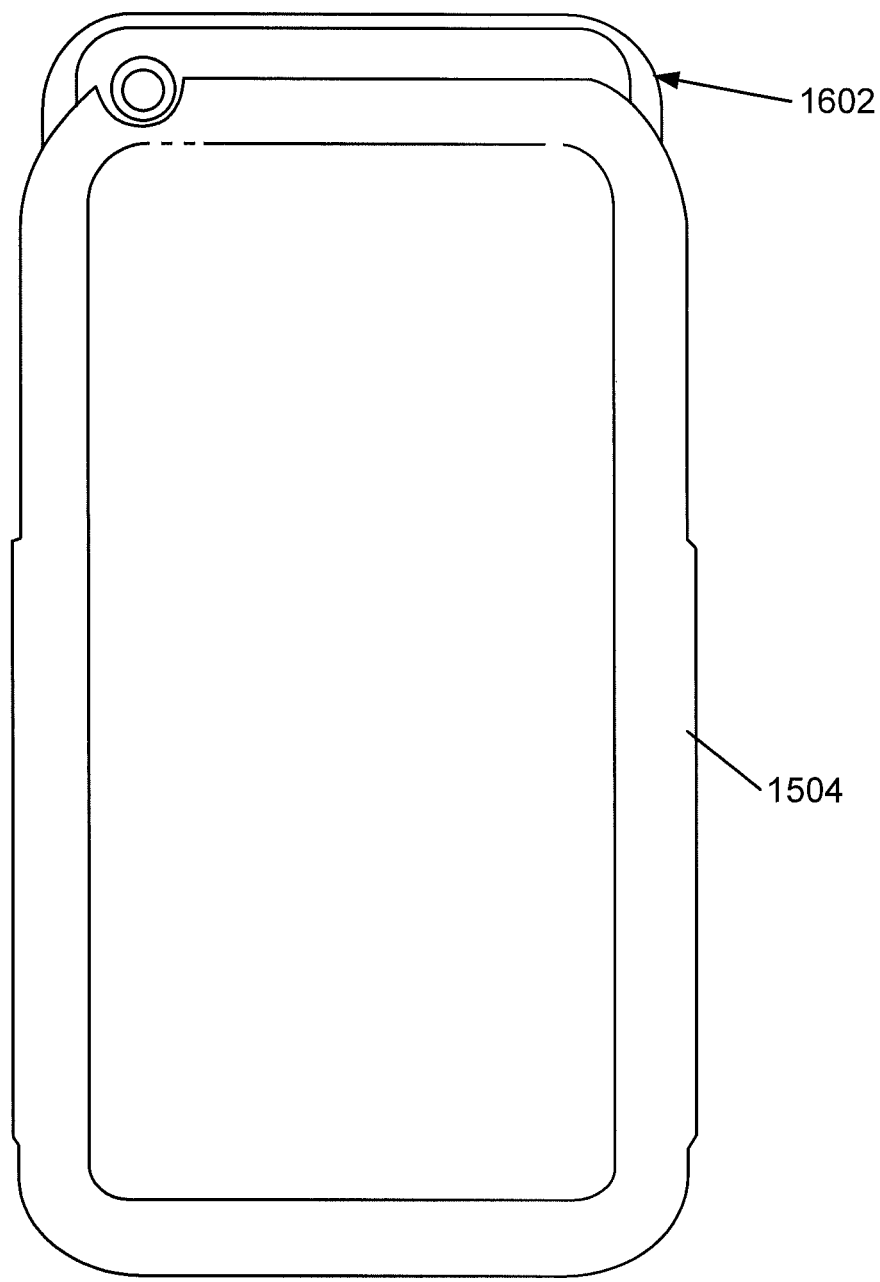
FIG. 21 illustrates a back view of the battery pack with the mobile device inserted therein.

FIG. 21 illustrates a hack view of the battery pack 1502 with the mobile device 1602 inserted therein.

Figure 22:
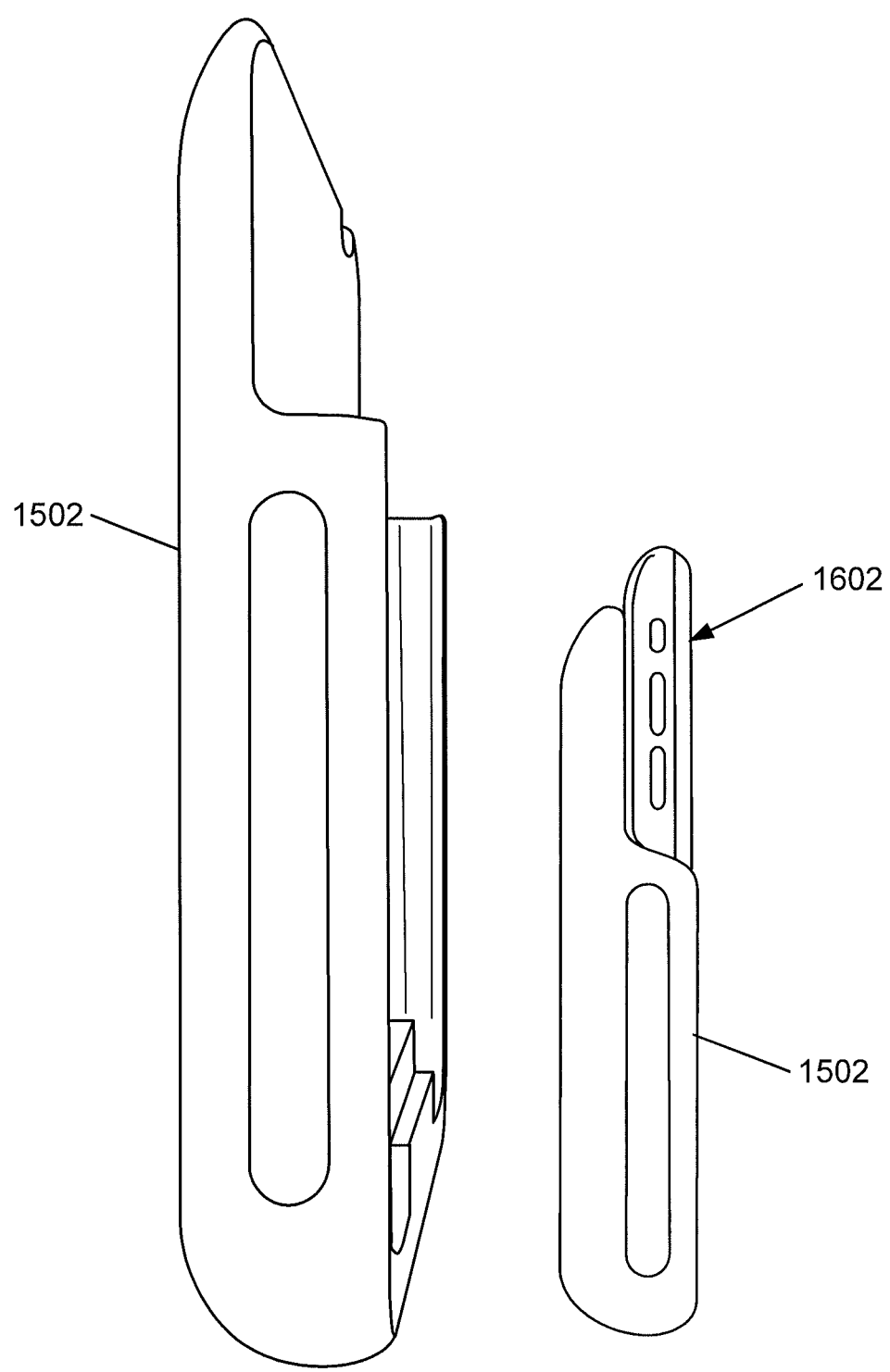
FIG. 22 illustrates a side view of the battery pack with and without the mobile device.

FIG. 22 illustrates a side view of the battery pack 1502 with and without the mobile device 1602. Note that, in some embodiments, the left and right sides may be symmetrical.

Extendible Processing and Interfacing Platform

Figure 17:
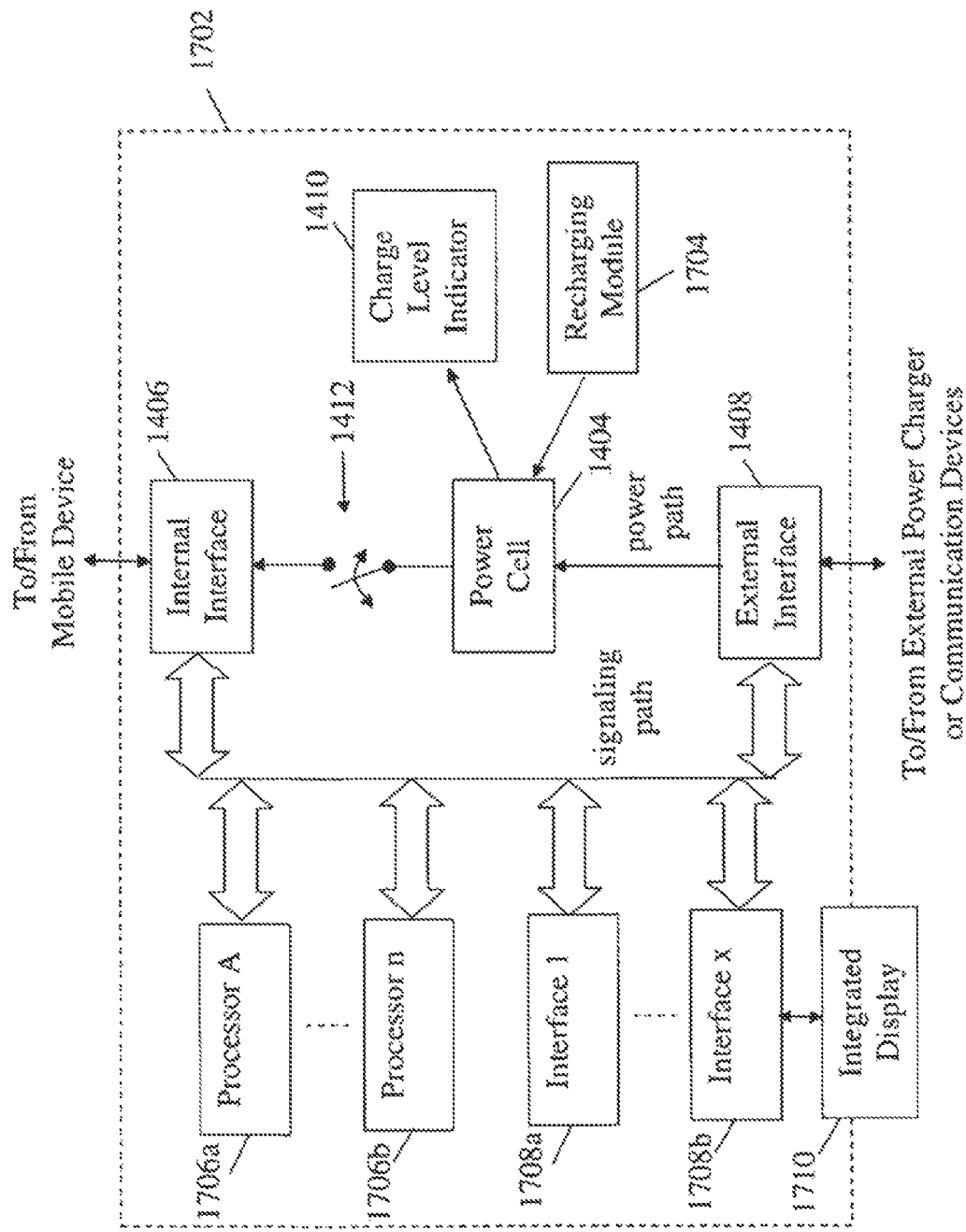
FIG. 17 illustrates a battery pack that also operates as an extendible processing and/or interfacing platform for a mobile device

FIG. 17 illustrates a battery pack that also operates as an extendible processing and/or interfacing platform for a mobile device. In one example, the battery pack 1702 may operate as described with reference to FIG. 14. In addition, the battery pack may also include one or more processors 1706 and/or one or more interfaces 1708. The one or more processors 1706a and 1706b may allow a mobile device coupled to the internal interface 1406 to extend its processing capabilities. For instance, the mobile device may cause one or more applications to be executed on the one or more processors 1706 while using a user display on the mobile device as an output interface. Additionally, the processors 1706a and/or 1706b may be purpose-specific processors that allow the mobile device to perform particular tasks not otherwise possible on its own. For example, the processors 1706 may provide analog-to-digital conversion, audio signal sampling, temperature measuring, etc., which may not be available to the standard mobile device.

The one or more interfaces 1708a and 1708b may also provide the mobile device a means by which to communicate or acquire signals. These interfaces 1708 may effectively expand the communication interfaces available to the mobile device by providing wired and/or wireless communication interfaces for various types of signals (e.g., audio, infrared, etc.).

The battery pack 1702 may also include a recharging module 1704 that facilitates recharging of the power cell 1404. For example, the recharging module 1704 may be a wireless or cordless charging device that inductively or otherwise facilitates recharging of the power cell 1404.

In one example implementation, the battery pack 1702 may be adapted to function as a Medical Processing Unit which may have build-in capabilities for monitoring real-time health conditions (e.g., alcohol levels in breath, pulse, temperature, blood pressure, test and/or diagnose diabetes, etc.) via build-in test port. Consequently, the battery pack 1702 can collect and/or process such collected data and store it in the mobile device. Note that the processing of such data may be directed by an application that operates either on the one or more processors of the battery pack 1702 and/or the processor(s) of the mobile device. According to one feature, if an abnormal health condition occurs (e.g., a heart attack, fainting, seizure, etc.), the Medical Processing Unit may detect this condition and automatically activate the mobile device (e.g., cellular phone) to send urgent text message or entails to a doctor, hospital, or emergency responder. The responding party (doctor, hospital, emergency responder) may be able to locate the patient via a global positioning system or information from the mobile device.

In another example implementation, the battery pack 1702 may be adapted to function as a Gaming Processing Unit that may include the capability of turning the mobile device into a real handheld gaming device with joysticks or large PSP/DS type of gaming buttons and communication devices. Consequently, the mobile device may be configured to operate as an input and/or output interface (e.g., via a display on the mobile device or battery pack) for a game.

In yet another example, the battery pack 1702 may be adapted to function as a Home Entertainment Unit that may include the capability of turning the mobile device into a Universal Smart Remote Control which can control all the IR activated units in a home or office (e.g. control garage doors, television sets, security alarm, air conditioning, lighting, etc.). For this purpose, the battery pack 1702 may include various interfaces 1708 that provide the specific infrared and/or wireless protocols and/or signaling to control such devices.

Speakers & Microphone

Another feature may provide for one or more speakers to be included as part of the battery packs or holster (illustrated in FIGS. 1-22). For instance a low-profile speaker may be housed within the back plane of a battery pack so that the sound may be emitted from the rear or sides of the battery pack. When a mobile device is inserted and coupled to the battery pack, it couples to an interface that electrically connects the speaker to the mobile device. The mobile device may send audio or sound signals to the speaker via an interface with the battery pack. This allows a user to listen to audio stored in the mobile device without the need, for headphones.

Similarly, another feature may provide for one or more microphones to be included as part of the battery packs (illustrated in FIGS. 1-22). One or more microphones may be housed within the battery pack (e.g., hack plane) so that they may capture sound from a user. The microphone may be electrically coupled to an interface that allows sending captured audio signals to a mobile device that may be coupled to the battery pack.

According to yet another feature, when the mobile device is coupled to the battery pack 1702, it may cause one or more applications to execute on the processors 1706. These applications may continue to operate or execute even if the mobile device is removed or decoupled from the battery pack 1702. For example, the battery pack may continue to collect data (e.g., monitor medical conditions for a patient to which it is coupled) and wirelessly transmits the collected data or an alarm to the mobile device. This is possible since the processors 1706 may be powered by the power cell 1404 and can be configured to operate whether or not the mobile device is coupled to the battery pack.

Integrated Display

In some embodiments of the battery pack 1702, battery pack 1702 may also include an integrated display or screen. For example, the integrated display may be on the outer surface of the hack plane of the battery pack. Alternatively, the display 1710 may slide out from within the housing of the battery pack. This integrated display 1720 may allow displaying additional information or data to a user. The additional display screen may be electrically coupled to the mobile device (via an interface) to allow the mobile device to send images or video to the additional display screen.

In another example, the rear of the hack plane may house a Braille input and/or output interface that electrically coupled a mobile device mounted within the holster or battery pack.

In yet another embodiment, the rear of the hack plane may provide a keypad that serves as an input to the mobile device.

According to another feature, the battery pack and/or holster may provide an external interface (e.g., Bluetooth wireless interface, USB port, infrared port, etc.) that may allow the mobile device mounted in the battery pack and/or holster to communicate via that external interface. Thus the external interface may provide a different wireless interface than provided or supported by the internal system of the mobile device.

Consequently, a battery pack for a mobile communication device is provided comprising: (a) a casing or holster (e.g., FIG. 4, 402 and/or 404) defining a cavity (FIG. 1, 102) that conforms, at least partially, to the outer shape of the mobile communication device (FIG. 2, 202); and/or (h) one or more rechargeable power cells (FIG. 13, 1306) housed within the thickness (between 1302 and 1304) of the casing. The casing secures the mobile communication device (202) within the cavity (102) while at least one surface (e.g., a display screen) of the mobile communication device remains exposed. An internal interface (106) engages a corresponding interface on the mobile communication device to provide power from the one or more rechargeable cells (1306) to the mobile communication device. An external interface (FIG. 6, 602) electrically couples to the internal interface (106) to transmit signals from the mobile communication device to an external device. The external interface (602) may further serve to recharge the one or more rechargeable power cells. The casing further defines one or more access openings (104, 108, 110, 112) to permit access to integrated interfaces of the mobile communication device (202).

The battery pack (100 or 1502) may further include a recharging device (1704) integrated within the battery pack that wirelessly recharges the one or more rechargeable power cells (1306).

An extendible communication and/or processing platform may be provided to mobile communication device by the battery back. For instance, a plurality of communication interfaces (1708) may be coupled to the internal interface (106 or 1406), wherein the mobile communication device (202) can transmit and receive signals via the communication interfaces (1708). Similarly, at least one processor (1706) may be coupled to the internal interface (106 or 1406), and adapted to collect information via one or more interfaces (1708) of the battery pack and provide the collected information to the mobile communication device (202). At least one processor (1706) may be adapted to execute one or more instructions under the control of the mobile communication device (202). According to one feature, a display interface (1710) may be integrated into the battery pack to display information to a user.

The thickness of the battery pack (100 or 1502) is less than twice the thickness of the mobile communication device. In some embodiments, the thickness of the battery pack may extend, for example, between ten and ninety percent more than the thickness of the mobile communication device. For example, the battery pack may extend a mere thirty to fifty percent more than the thickness of the mobile communication device.

Similarly, a battery pack (100) for a mobile device (202) may include (a) a back plane (304), (h) a first and second sides (306 and 308), (c) a bottom side (312), wherein the hack plane (304) and first (306), second (308) and bottom (312) sides define a cavity (102) for mounting the mobile device (202); and (d) one or more battery cells (1306) housed within the thickness of the back plane (304). One or more speakers may be housed within the thickness of the hack plane (304) and electrically coupled to an interface (106) to allow a mobile device (202) mounted in the cavity (102) to send audio signals through the one or more speakers. Similarly, one or more microphones may be housed within the thickness of the back plane (304) and electrically coupled to an interface (106) to allow a mobile device (202) mounted in the cavity (102) to receive audio signals from the one or more microphones.

One or more of the features illustrated in FIGS. 1-22 may be rearranged and/or combined into a single component or embodied in several components. Additional components may also be added without departing from the invention.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

The invention claimed is:

1. A battery pack for a mobile device comprising:
  (i) a bottom section comprising:
    (1) a back plane upon which a back of a housing of the mobile device will be placed against, wherein the back plane comprises a top edge;
    (2) a battery cell, enclosed in the bottom section;
    (3) electronic circuitry, coupled to the battery cell;
    (4) a bottom sidewall, connected to the back plane at an end opposite of the top edge, that will be positioned against a bottom side edge of the mobile device;
    (5) an internal interface, on the bottom sidewall, positioned to connect to an interface on the mobile device, and coupled through the electronic circuitry to the battery cell; and
    (6) an external interface, positioned on an outside bottom side of the bottom section, coupled through the electronic circuitry to the battery cell and internal interface; and
  (ii) a top section comprising:
    (1) a top side that will be positioned against a top side edge of the mobile device when the top section is seated against the bottom section; and
    (2) an open side end, opposite of the top side, wherein the top section slides onto the bottom section through the open side end,
    wherein when the top section is seated against the bottom section, the top and bottom sections meet at and form a seam which extends across a back of the battery pack,
    wherein when the top section is seated against the bottom section to form the back of the battery pack, and wherein the top section overlaps at least one portion of the bottom section to hold the top section to the bottom section, and
    when the top section is seated against the bottom section, a first open-polygon-shaped opening for the bottom section merges with a second open-polygon-shaped opening for the top section to form a cavity of the battery pack through which a screen of the mobile device will be visible, the cavity having a closed shape.

2. The battery pack of claim 1, wherein the bottom section further comprises:
  (7) a back surface having a button, coupled to the electronic circuitry, positioned on a side of the seam closer to the outside bottom side of the bottom section.

3. The battery pack of claim 1, wherein the first open-polygon-shaped opening comprises a U shape and the second open-polygon-shaped opening comprises an upside-down U shape.

4. The battery pack of claim 1, wherein the bottom section further comprises:
  (7) a button, coupled to the electronic circuitry.

5. The battery pack of claim 4, wherein the bottom section further comprises:
  (8) a plurality of LED lights, coupled to the electronic circuitry, and wherein the LED lights indicate a power or charge level for the battery cell.

6. The battery pack of claim 1, wherein when connecting a cable to the external interface of the bottom section, the cable does not pass through any opening of the top section.

7. The battery pack of claim 1, wherein the external interface comprises a micro USB connector.

8. The battery pack of claim 1, wherein electronic components are provided on one or more circuit boards, enclosed within the bottom section.

9. The battery pack of claim 1, wherein the battery cell can be charged via the external interface and wherein the mobile device, when coupled to the internal interface, can communicate with an external device via the external interface.

10. The battery pack of claim 9, wherein a plurality of LED lights, visible on the back of the battery pack, indicate a power or charge level of the battery cell.

11. The battery pack of claim 3, wherein the closed shape comprises a contoured rectangle shape.

12. A battery pack for a mobile device comprising:
  (i) a bottom section comprising:
    (1) a back plane upon which a back of a housing of the mobile device will be placed against, wherein the back plane comprises a top edge;
    (2) a battery cell, enclosed in the bottom section;
    (3) electronic circuitry, coupled to the battery cell;
    (4) a bottom sidewall, connected to the back plane at an end opposite of the top edge, that will be positioned against a bottom side edge of the mobile device;
    (5) an internal interface, on the bottom sidewall, positioned to connect to an interface on the mobile device, and coupled through the electronic circuitry to the battery cell; and (6) an external interface, positioned on an outside bottom side of the bottom section, coupled through the electronic circuitry to the battery cell and internal interface; and (ii) a top section comprising:
  (1) a top side that will be positioned against a top side edge of the mobile device when the top section is seated against the bottom section; and
  (2) an open side end, opposite of the top side, wherein the top section slides onto the bottom section through the open side end,
  wherein when the top section is seated against the bottom section, the top and bottom sections meet at and form a seam which extends across a back of the battery pack, and
  when the top section is seated against the bottom section, a first open-polygon-shaped opening for the bottom section merges with a second open-polygon-shaped opening for the top section to form a cavity of the battery pack through which a screen of the mobile device will be visible, the cavity having a closed shape, and
  wherein when the interface of the mobile device is connected to the internal interface of the bottom section and the screen of the mobile device faces up the battery cell is positioned under the back of the housing of the mobile device.

13. A method of making a mobile device battery pack, the method comprising the steps of:
  (a) providing a bottom section of the battery pack for the mobile device, the bottom section comprising:
  (i) a base front surface; and
  (ii) a base back surface,
  wherein a housing of the mobile device will be placed against the base front surface;
  (b) enclosing a battery cell between the base front surface and the base back surface;
  (c) connecting one or more electronic circuitries to the battery cell and an internal interface and external interface; and
  (d) providing a top section for the battery pack for the mobile device that slides onto the bottom section, wherein when the top section is seated against the bottom section, the top and bottom sections form a seam which extends across a back of the battery pack, and when the top section is seated against the bottom section, a first open-shaped opening for the bottom section merges with a second open-shaped opening for the top section to form a cavity of the battery pack through which a screen of the mobile device will be visible, the cavity having a closed shape, and wherein when the interface of the mobile device is connected to the internal interface of the bottom section and the screen of the mobile device faces up the battery cell is positioned under the back of the housing of the mobile device.

14. A case for an electronic device comprising:
a lower case portion comprising:
  a base surface upon which a back of a housing of the electronic device will be placed against, wherein the base surface comprises a top edge;
  a battery, enclosed in the lower case portion;
  electronic circuitry, coupled to the battery;
  a lower sidewall, connected to the base surface at an end opposite of the top edge, that will be positioned against a bottom side edge of the electronic device;
  an inner connector, on the lower sidewall, positioned to connect to a connector of the electronic device, and coupled through the electronic circuitry to the battery; and
  an outer connector, positioned on an outside bottom side of the lower case portion, coupled through the electronic circuitry to the battery and inner connector; and
an upper case portion comprising:
  an upper sidewall that will be positioned against a top side edge of the electronic device when the upper case portion is seated against the lower case portion; and
  an open side end, opposite of the upper sidewall,
  wherein the upper case portion slides onto the lower case portion through the open side end in a direction along the base surface from the top edge to the lower sidewall,
  wherein when the upper case portion is seated against the lower case portion, the upper and lower case portions meet at and form a seam which extends across a back of the case, and
  when the upper case portion is seated against the lower case portion, a first open-polygon-shaped opening for the lower case portion merges with a second open-polygon-shaped opening for the upper case portion to form a front opening of the case through which a screen of the electronic device will be visible, the front opening having a closed shape, and
  wherein when the interface of the mobile device is connected to the internal interface of the bottom section and the screen of the mobile device faces up the battery cell is positioned under the back of the housing of the mobile device.

15. A case for an electronic device comprising:
a first case portion comprising:
  a base surface upon which a back of a housing of the electronic device will be placed against, wherein the base surface comprises a top edge;
  a battery, enclosed in the first case portion;
  electronic circuitry, coupled to the battery;
  a lower sidewall, connected to the base surface at an end opposite of the top edge, that will be positioned against a bottom side edge of the electronic device;
  an inner connector, on the lower sidewall, positioned to connect to a connector of the electronic device, and coupled through the electronic circuitry to the battery; and
  an outer connector, positioned on an outside of the first case portion, coupled through the electronic circuitry to the battery and inner connector; and
a second case portion comprising:
  an upper sidewall that will be positioned against a top side edge of the electronic device when the second case portion is seated against the first case portion; and
  an open side end, opposite of the upper sidewall,
  wherein the second case portion slides onto the first case portion through the open side end,
  wherein when the second case portion is seated against the first case portion, the first and second case portions meet at and form a seam which extends across a back of the case, and
  when the second case portion is seated against the first case portion, a first open-shaped opening for the first case portion merges with a second open-shaped opening for the second case portion to form a front opening of the case through which a screen of the electronic device will be visible, the front opening having a closed shape, and wherein when the interface of the mobile device is connected to the internal interface of the bottom section and the screen of the mobile device faces up the battery cell is positioned under the back of the housing of the mobile device.

16. A method of making an electronic device case comprising:

providing a lower case portion of the electronic device case comprising a base front surface and base back surface, wherein a housing of an electronic device will be placed against the base front surface;

enclosing a battery between the base front surface and base back surface;

connecting electronic circuitry to the battery, to an inner connector and to an outer connector; and providing an upper case portion for the electronic device case that slides onto the lower case portion, wherein when the upper case portion is seated against the lower case portion, the upper and lower case portions form a seam which extends across a back of the case, and when the upper case portion is seated against the lower case portion, a first open-shaped opening for the lower case portion merges with a second open-shaped opening for the upper case portion to form a front opening of the case through which a screen of the electronic device will be visible, the front opening having a closed shape, and wherein when the interface of the mobile device is connected to the internal interface of the bottom section and the screen of the mobile device faces up the battery cell is positioned under the back of the housing of the mobile device.

17. A method of making an electronic device case comprising:

providing a first case portion of the electronic device case comprising a base front surface and base back surface, wherein a housing of an electronic device will be placed against the base front surface;

enclosing a battery between the base front surface and base back surface;

connecting electronic circuitry to the battery and an inner and outer connector, wherein the electronic circuitry implements a charging mode during which the battery can be charged via the outer connector, and a sync mode during which an electronic device when coupled to the inner connector can be synchronized with another electronic device coupled to the outer connector; and providing a second case portion for the electronic device case that slides onto the first case portion, wherein when the second case portion is seated against the first case portion, the first and second case portions form a seam which extends across a back of the case, and when the second case portion is seated against the first case portion, a first open-shaped opening for the first case portion merges with a second open-shaped opening for the second case portion to form a front opening of the case through which a screen of the electronic device will be visible, the front opening having a closed shape, and wherein when the interface of the mobile device is connected to the internal interface of the bottom section and the screen of the mobile device faces up the battery cell is positioned under the back of the housing of the mobile device.

18. A battery pack for a mobile device comprising:
(i) a bottom section comprising:
(1) a back plane upon which a back of a housing of the mobile device will be placed against, wherein the back plane comprises a top edge;
(2) a battery cell, enclosed in the bottom section;
(3) electronic circuitry, coupled to the battery cell;
(4) a bottom sidewall, connected to the back plane at an end opposite of the top edge, that will be positioned against a bottom side edge of the mobile device;
(5) an internal interface, on the bottom sidewall, positioned to connect to an interface on the mobile device, and coupled through the electronic circuitry to the battery cell;
(6) an external interface, positioned on an outside bottom side of the bottom section, coupled through the electronic circuitry to the battery cell and internal interface; and
(7) a plurality of LED lights, coupled to the electronic circuitry, and wherein the LED lights indicate a power or charge level for the battery cell; and
(ii) a top section comprising:
(1) a top side that will be positioned against a top side edge of the mobile device when the top section is seated against the bottom section; and
(2) an open side end, opposite of the top side,
wherein the top section slides onto the bottom section through the open side end,
wherein when the top section is seated against the bottom section, the top and bottom sections meet at and form a seam which extends across a back of the battery pack, and
when the top section is seated against the bottom section, a first open-polygon-shaped opening for the bottom section merges with a second open-polygon-shaped opening for the top section to form a cavity of the battery pack through which a screen of the mobile device will be visible, the cavity having a closed shape.

19. A method of making a mobile device battery pack, the method comprising the steps of:
(a) providing a bottom section of the battery pack for the mobile device, the bottom section comprising:
(i) a base front surface;
(ii) a base back surface; and
(iii) a plurality of LED lights wherein a housing of the mobile device will be placed against the base front surface;
(b) enclosing a battery cell between the base front surface and the base back surface;
(c) connecting one or more electronic circuitries to the battery cell, to the plurality of LED lights, to an internal interface and to an external interface; and
(d) providing a top section for the battery pack for the mobile device that slides onto the bottom section,
wherein when the top section is seated against the bottom section, the top and bottom sections form a seam which extends across a back of the battery pack, and
when the top section is seated against the bottom section, a first open-shaped opening for the bottom section merges with a second open-shaped opening for the top section to form a cavity of the battery pack through which a screen of the mobile device will be visible, the cavity having a closed shape.

20. A case for an electronic device comprising:
a lower case portion comprising:
- a base surface upon which a back of a housing of the electronic device will be placed against, wherein the base surface comprises a top edge;
- a battery, enclosed in the lower case portion;
- electronic circuitry, coupled to the battery;
- a lower sidewall, connected to the base surface at an end opposite of the top edge, that will be positioned against a bottom side edge of the electronic device;
- an inner connector, on the lower sidewall, positioned to connect to a connector of the electronic device, and coupled through the electronic circuitry to the battery; and
- an outer connector, positioned on an outside bottom side of the lower case portion, coupled through the electronic circuitry to the battery and inner connector; and
- a plurality of LED lights, coupled to the electronic circuitry; and an upper case portion comprising:
- an upper sidewall that will be positioned against a top side edge of the electronic device when the upper case portion is seated against the lower case portion; and
- an open side end, opposite of the upper sidewall,
- wherein the upper case portion slides onto the lower case portion through the open side end in a direction along the base surface from the top edge to the lower sidewall,
- wherein when the upper case portion is seated against the lower case portion, the upper and lower case portions meet at and form a seam which extends across a back of the case, and
- when the upper case portion is seated against the lower case portion, a first open-polygon-shaped opening for the lower case portion merges with a second open-polygon-shaped opening for the upper case portion to form a front opening of the case through which a screen of the electronic device will be visible, the front opening having a closed shape.

21. A case for an electronic device comprising:
a first case portion comprising:
- a base surface upon which a back of a housing of the electronic device will be placed against, wherein the base surface comprises a top edge;
- a battery, enclosed in the first case portion;
- electronic circuitry, coupled to the battery;
- a lower sidewall, connected to the base surface at an end opposite of the top edge, that will be positioned against a bottom side edge of the electronic device;
- an inner connector, on the lower sidewall, positioned to connect to a connector of the electronic device, and coupled through the electronic circuitry to the battery; and
- an outer connector, positioned on an outside of the first case portion, coupled through the electronic circuitry to the battery and inner connector; and
- a plurality of LED lights, coupled to the electronic circuitry; and a second case portion comprising:
- an upper sidewall that will be positioned against a top side edge of the electronic device when the second case portion is seated against the first case portion; and
- an open side end, opposite of the upper sidewall,
- wherein the second case portion slides onto the first case portion through the open side end,
- wherein when the second case portion is seated against the first case portion, the first and second case portions meet at and form a seam which extends across a back of the case, and
- when the second case portion is seated against the first case portion, a first open-shaped opening for the first case portion merges with a second open-shaped opening for the second case portion to form a front opening of the case through which a screen of the electronic device will be visible, the front opening having a closed shape.

22. A method of making an electronic device case comprising:
- providing a lower case portion of the electronic device case comprising a base front surface and base back surface, wherein a housing of an electronic device will be placed against the base front surface;
- enclosing a battery between the base front surface and base back surface;
- connecting electronic circuitry to the battery, to a plurality of LED lights, to an inner connector and to an outer connector; and
- providing an upper case portion for the electronic device case that slides onto the lower case portion, wherein when the upper case portion is seated against the lower case portion, the upper and lower case portions form a seam which extends across a back of the case, and
- when the upper case portion is seated against the lower case portion, a first open-shaped opening for the lower case portion merges with a second open-shaped opening for the upper case portion to form a front opening of the case through which a screen of the electronic device will be visible, the front opening having a closed shape.

23. A method of making an electronic device case comprising:
- providing a first case portion of the electronic device case comprising a base front surface and base back surface, wherein a housing of an electronic device will be placed against the base front surface;
- enclosing a battery between the base front surface and base back surface;
- connecting electronic circuitry to the battery, to a plurality of LED lights, to an inner connector and to an outer connector, wherein the electronic circuitry implements a charging mode during which the battery can be charged via the outer connector, and a sync mode during which an electronic device when coupled to the inner connector can be synchronized with another electronic device coupled to the outer connector; and
- providing a second case portion for the electronic device case that slides onto the first case portion, wherein when the second case portion is seated against the first case portion, the first and second case portions form a seam which extends across a back of the case, and
- when the second case portion is seated against the first case portion, a first open-shaped opening for the first case portion merges with a second open-shaped opening for the second case portion to form a front opening of the case through which a screen of the electronic device will be visible, the front opening having a closed shape.

24. A battery pack for a mobile device comprising:
(i) a bottom section comprising:
(1) a back plane upon which a back of a housing of the mobile device will be placed against, wherein the back plane comprises a top edge;

(2) a battery cell, enclosed in the bottom section;
(3) electronic circuitry, coupled to the battery cell;
(4) a bottom sidewall, connected to the back plane at an end opposite of the top edge, that will be positioned against a bottom side edge of the mobile device;
(5) an internal interface, on the bottom sidewall, positioned to connect to an interface on the mobile device, and coupled through the electronic circuitry to the battery cell;
(6) an external interface, positioned on an outside bottom side of the bottom section, coupled through the electronic circuitry to the battery cell and internal interface; and
(7) a button coupled directly and mechanically to a back surface of the bottom section and coupled to the electric circuitry; and
(ii) a top section comprising:
(1) a top side that will be positioned against a top side edge of the mobile device when the top section is seated against the bottom section; and
(2) an open side end, opposite of the top side, wherein the top section slides onto the bottom section through the open side end,
wherein when the top section is seated against the bottom section, the top and bottom sections meet at and form a seam which extends across a back of the battery pack, and
when the top section is seated against the bottom section, a first open-polygon- shaped opening for the bottom section merges with a second open-polygon-shaped opening for the top section to form a cavity of the battery pack through which a screen of the mobile device will be visible, the cavity having a closed shape.

25. A method of making a mobile device battery pack, the method comprising the steps of:
(a) providing a bottom section of the battery pack for the mobile device, the bottom section comprising:
(i) a base front surface;
(ii) a base back surface; and
(iii) a button, coupled directly and mechanically to the base back, surface;
wherein a housing of the mobile device will be placed against the base front surface;
(b) enclosing a battery cell between the base front surface and the base back surface;
(c) connecting one or more electronic circuitries to the battery cell, to the button, to an internal interface and to an external interface; and
(d) providing a top section for the battery pack for the mobile device that slides onto the bottom section,
wherein when the top section is seated against the bottom section, the top and bottom sections form a seam which extends across a back of the battery pack, and
when the top section is seated against the bottom section, a first open-shaped opening for the bottom section merges with a second open-shaped opening for the top section to form a cavity of the battery pack through which a screen of the mobile device will be visible, the cavity having a closed shape.

26. A kit for a mobile device battery pack comprising:
(i) a tray comprising:
(1) a first compartment and
(2) a second compartment;
(ii) a cable, contained within the first compartment; and
(iii) a battery pack for the mobile device, contained within the second compartment,
wherein the mobile device battery pack comprises:
(1) a bottom section comprising:
(A) a base front surface;
(B) a base back surface;
(C) a button coupled directly and mechanically to the back surface;
(D) a battery cell, contained between the base front surface and the base back surface, wherein a housing of the mobile device will be placed against the base front surface; and
(E) electronic circuitry, coupled to the battery cell and to the button; and
(2) a top section, optionally attached to the bottom section,
wherein a first open-polygon opening for the bottom section merges with a second open-polygon opening for the top section to form a cavity of the battery pack through which a screen of the mobile device will be visible, the cavity having a closed-polygon shape.

27. A case for an electronic device comprising:
a lower case portion comprising:
a base surface upon which a back of a housing of the electronic device will be placed against, wherein the base surface comprises a top edge;
a battery, enclosed in the lower case portion;
electronic circuitry, coupled to the battery;
a lower sidewall, connected to the base surface at an end opposite of the top edge, that will be positioned against a bottom side edge of the electronic device;
an inner connector, on the lower sidewall, positioned to connect to a connector of the electronic device, and coupled through the electronic circuitry to the battery; and
an outer connector, positioned on an outside bottom side of the lower case portion, coupled through the electronic circuitry to the battery and inner connector; and
a button coupled directly and mechanically to a base back surface of the lower case portion and coupled to the electronic circuitry; and
an upper case portion comprising:
an upper sidewall that will be positioned against a top side edge of the electronic device when the upper case portion is seated against the lower case portion; and
an open side end, opposite of the upper sidewall,
wherein the upper case portion slides onto the lower case portion through the open side end in a direction along the base surface from the top edge to the lower sidewall,
wherein when the upper case portion is seated against the lower case portion, the upper and lower case portions meet at and form a seam which extends across a back of the case, and
when the upper case portion is seated against the lower case portion, a first open-polygon-shaped opening for the lower case portion merges with a second open-polygon-shaped opening for the upper case portion to form a front opening of the case through which a screen of the electronic device will be visible, the front opening having a closed shape.

28. A case for an electronic device comprising:
a first case portion comprising:
a base surface upon which a back of a housing of the electronic device will be placed against, wherein the base surface comprises a top edge;
a battery, enclosed in the first case portion;
electronic circuitry, coupled to the battery;

a lower sidewall, connected to the base surface at an end opposite of the top edge, that will be positioned against a bottom side edge of the electronic device;

an inner connector, on the lower sidewall, positioned to connect to a connector of the electronic device, and coupled through the electronic circuitry to the battery; and an outer connector, positioned on an outside of the first case portion, coupled through the electronic circuitry to the battery and inner connector; and a button coupled directly and mechanically to a base back surface of the first case portion and coupled to the electronic circuitry; and a second case portion comprising:

an upper sidewall that will be positioned against a top side edge of the electronic device when the second case portion is seated against the first case portion; and an open side end, opposite of the upper sidewall, wherein the second case portion slides onto the first case portion through the open side end, wherein when the second case portion is seated against the first case portion, the first and second case portions meet at and form a seam which extends across a back of the case, and when the second case portion is seated against the first case portion, a first open-shaped opening for the first case portion merges with a second open-shaped opening for the second case portion to form a front opening of the case through which a screen of the electronic device will be visible, the front opening having a closed shape.

29. A method of making an electronic device case comprising:

providing a lower case portion of the electronic device case comprising a base front surface and base back surface, wherein a housing of an electronic device will be placed against the base front surface;

enclosing a battery between the base front surface and base back surface;

connecting electronic circuitry to the battery, to a button coupled directly and mechanically to the base back surface of the lower case portion, to an inner and to an outer connector; and providing an upper case portion for the electronic device case that slides onto the lower case portion, wherein when the upper case portion is seated against the lower case portion, the upper and lower case portions form a seam which extends across a back of the case, and when the upper case portion is seated against the lower case portion, a first open-shaped opening for the lower case portion merges with a second open-shaped opening for the upper case portion to form a front opening of the case through which a screen of the electronic device will be visible, the front opening having a closed shape.

30. A method of making an electronic device case comprising:

providing a first case portion of the electronic device case comprising a base front surface and base back surface, wherein a housing of an electronic device will be placed against the base front surface;

enclosing a battery between the base front surface and base back surface;

connecting electronic circuitry to the battery, to a button coupled directly and mechanically to the base back surface, to an inner connector and to an outer connector, wherein the electronic circuitry implements a charging mode during which the battery can be charged via the outer connector, and a sync mode during which an electronic device when coupled to the inner connector can be synchronized with another electronic device coupled to the outer connector; and providing a second case portion for the electronic device case that slides onto the first case portion, wherein when the second case portion is seated against the first case portion, the first and second case portions form a seam which extends across a back of the case, and when the second case portion is seated against the first case portion, a first open-shaped opening for the first case portion merges with a second open-shaped opening for the second case portion to form a front opening of the case through which a screen of the electronic device will be visible, the front opening having a closed shape.

31. A battery pack for a mobile device comprising:

(i) a bottom section comprising:

(1) a back plane upon which a back of a housing of the mobile device will be placed against, wherein the back plane comprises a top edge;

(2) a battery cell, enclosed in the bottom section;

(3) electronic circuitry, coupled to the battery cell;

(4) a bottom sidewall, connected to the back plane at an end opposite of the top edge, that will be positioned against a bottom side edge of the mobile device;

(5) an internal interface, on the bottom sidewall, positioned to connect to an interface on the mobile device, and coupled through the electronic circuitry to the battery cell; and (6) an external interface, positioned on an outside bottom side of the bottom section, coupled through the electronic circuitry to the battery cell and internal interface;

(7) a guide on a sidewall;

(8) an insert section; and (ii) a top section comprising:

(1) a top side that will be positioned against a top side edge of the mobile device when the top section is seated against the bottom section; and (2) an open side end, opposite of the top side, wherein, when the top section slides on the guide of the bottom section and over the insert section to attach to the bottom section, an edge of the top section overlaps with an edge of the bottom section to form the seam, and exterior surfaces of the bottom section and top section at the seam become flush with each other;

wherein when the top section is seated against the bottom section, the top and bottom sections meet at and form a seam which extends across a back of the battery pack, and when the top section is seated against the bottom section, a first open-polygon- shaped opening for the bottom section merges with a second open-polygon-shaped opening for the top section to form a cavity of the battery pack through which a screen of the mobile device will be visible, the cavity having a closed shape.

32. A method of making a mobile device battery pack, the method comprising the steps of:

(a) providing a bottom section of the battery pack for the mobile device, the bottom section comprising:

(i) a base front surface; and (ii) a base back surface, wherein a housing of the mobile device will be placed against the base front surface;

(b) forming in the bottom section a guide on a sidewall and an insert section;
(c) enclosing a battery cell between the base front surface and the base back surface;
(d) connecting one or more electronic circuitries to the battery cell and an internal interface and external interface;
(e) providing a top section for the battery pack for the mobile device that slides on the guides of the bottom section and over the insert section to attach to the bottom section and an edge of the top section overlaps with an edge of the bottom section to form a seam and exterior surfaces of the bottom section and top section at the seam become flush with each other; and
wherein when the top section is seated against the bottom section, the top and bottom sections form a seam which extends across a back of the battery pack, and
when the top section is seated against the bottom section, a first open-shaped opening for the bottom section merges with a second open-shaped opening for the top section to form a cavity of the battery pack through which a screen of the mobile device will be visible, the cavity having a closed shape.

33. A case for an electronic device comprising:
a lower case portion comprising:
    a base surface upon which a back of a housing of the electronic device will be placed against, wherein the base surface comprises a top edge;
    a battery, enclosed in the lower case portion;
    electronic circuitry, coupled to the battery;
    a lower sidewall, connected to the base surface at an end opposite of the top edge, that will be positioned against a bottom side edge of the electronic device;
    an inner connector, on the lower sidewall, positioned to connect to a connector of the electronic device, and coupled through the electronic circuitry to the battery; and
    an outer connector, positioned on an outside bottom side of the lower case portion, coupled through the electronic circuitry to the battery and inner connector; a guide on a sidewall, and
an insert section, and an upper case portion comprising:
    an upper sidewall that will be positioned against a top side edge of the electronic device when the upper case portion is seated against the lower case portion; and
    an open side end, opposite of the upper sidewall,
        wherein, when the upper case portion slides on the guide of the lower case portion and over the insert section through the open side end in a direction along the base surface from the top edge to the lower sidewall to attach to the lower case portion, an edge of the upper case portion overlaps with an edge of the lower case portion to form a seam, and exterior surfaces of the lower case portion and upper case portion at the seam become flush with each other,
        wherein when the upper case portion is seated against the lower case portion, the upper and lower case portions meet at and form a seam which extends across a back of the case, and
        when the upper case portion is seated against the lower case portion, a first open-polygon-shaped opening for the lower case portion merges with a second open-polygon-shaped opening for the upper case portion to form a front opening of the case through which a screen of the electronic device will be visible, the front opening having a closed shape.

34. A case for an electronic device comprising:
a first case portion comprising:
    a base surface upon which a back of a housing of the electronic device will be placed against, wherein the base surface comprises a top edge;
    a battery, enclosed in the first case portion;
    electronic circuitry, coupled to the battery;
    a lower sidewall, connected to the base surface at an end opposite of the top edge, that will be positioned against a bottom side edge of the electronic device;
    an inner connector, on the lower sidewall, positioned to connect to a connector of the electronic device, and coupled through the electronic circuitry to the battery; and
    an outer connector, positioned on an outside of the first case portion, coupled through the electronic circuitry to the battery and inner connector;
    a guide on a sidewall, and
    an insert section, and
a second case portion comprising:
    an upper sidewall that will be positioned against a top side edge of the electronic device when the second case portion is seated against the first case portion; and
    an open side end, opposite of the upper sidewall,
        wherein, when the second case portion slides on the guide of the first case portion and over the insert section through the open side end to attach to the first case portion, an edge of the first case portion overlaps with an edge of the second case portion to form a seam, and exterior surfaces of the first case portion and second case portion at the seam become flush with each other, wherein when the second case portion is seated against the first case portion, the first and second case portions meet at and form a seam which extends across a back of the case, and
        when the second case portion is seated against the first case portion, a first open-shaped opening for the first case portion merges with a second open-shaped opening for the second case portion to form a front opening of the case through which a screen of the electronic device will be visible, the front opening having a closed shape.

35. A method of making an electronic device case comprising:
providing a lower case portion of the electronic device case comprising a base front surface and base back surface, wherein a housing of an electronic device will be placed against the base front surface;
forming in the lower case portion a guide on a sidewall and an insert section;
enclosing a battery between the base front surface and base back surface;
connecting electronic circuitry to the battery, to an inner connector and to an outer connector; and
providing an upper case portion for the electronic device case that slides on the guides of the lower case portion and over the insert section to attach to the lower case portion and wherein an edge of the upper case portion overlaps with an edge of the lower case portion to form a seam, and exterior surfaces of the lower case portion and upper case portion at the seam become flush with each other, wherein when the upper case portion is seated against the lower case portion, the upper and lower case portions form a seam which extends across a back of the case, and when the upper case portion is seated against the lower case portion, a first open-shaped opening for the lower case portion merges with a second open-shaped opening for the upper case portion to form a front opening of the case through which a screen of the electronic device will be visible, the front opening having a closed shape.

36. A method of making an electronic device case comprising:

providing a first case portion of the electronic device case comprising a base front surface and base back surface, wherein a housing of an electronic device will be placed against the base front surface;

forming in the first case portion a guide on a sidewall and an insert section;

enclosing a battery between the base front surface and base back surface;

connecting electronic circuitry to the battery and an inner and outer connector, wherein the electronic circuitry implements a charging mode during which the battery can be charged via the outer connector, and a sync mode during which an electronic device when coupled to the inner connector can be synchronized with another electronic device coupled to the outer connector; and providing a second case portion for the electronic device case that slides on the guides of the first case portion and over the insert section to attach to the first case portion and wherein an edge of the second case portion overlaps with an edge of the first case portion to form a seam, and exterior surfaces of the first case portion and second case portion at the seam become flush with each other, wherein when the second case portion is seated against the first case portion, the first and second case portions form a seam which extends across a back of the case, and when the second case portion is seated against the first case portion, a first open-shaped opening for the first case portion merges with a second open-shaped opening for the second case portion to form a front opening of the case through which a screen of the electronic device will be visible, the front opening having a closed shape.

37. A battery pack for a mobile device comprising:
(i) a bottom section comprising:
  (1) a back plane upon which a back of a housing of the mobile device will be placed against, wherein the back plane comprises a top edge;
  (2) a battery cell, enclosed in the bottom section;
  (3) electronic circuitry, coupled to the battery cell;
  (4) a bottom sidewall, connected to the back plane at an end opposite of the top edge, that will be positioned against a bottom side edge of the mobile device;
  (5) an internal interface, on the bottom sidewall, positioned to connect to an interface on the mobile device, and coupled through the electronic circuitry to the battery cell; and
  (6) an external interface, positioned on an outside bottom side of the bottom section, coupled through the electronic circuitry to the battery cell and internal interface; and (ii) a top section comprising:
  (1) a top side that will be positioned against a top side edge of the mobile device when the top section is seated against the bottom section; and
  (2) an open side end, opposite of the top side,
  wherein the top section slides onto the bottom section through the open side end,
  wherein when the top section is seated against the bottom section, the top and bottom sections meet at and form a seam which extends across a back of the battery pack and the top section and the bottom section together substantially replicate an external shape of the mobile device, and
  when the top section is seated against the bottom section, a first open-polygon-shaped opening for the bottom section merges with a second open-polygon-shaped opening for the top section to form a cavity of the battery pack through which a screen of the mobile device will be visible, the cavity having a closed shape.

38. A method of making a mobile device battery pack, the method comprising the steps of
  (a) providing a bottom section of the battery pack for the mobile device, the bottom section comprising:
    (i) a base front surface; and
    (ii) a base back surface,
    wherein a housing of the mobile device will be placed against the base front surface;
  (b) enclosing a battery cell between the base front surface and the base back surface;
  (c) connecting one or more electronic circuitries to the battery cell, to an internal interface and to an external interface; and
  (d) providing a top section for the battery pack for the mobile device that slides onto the bottom section,
    wherein when the top section is seated against the bottom section, the top and bottom sections from a seam which extends across a back of the pack and the top section and the bottom section together substantially replicate an external shape of the mobile device, and
    when the top section is seated against the bottom section, a first open-shaped opening for the bottom section merges with a second open-shaped opening for the top section to form a cavity of the battery pack through which a screen of the mobile device will be visible, the cavity having a closed shape.

39. A kit for a mobile device battery pack comprising:
(i) a tray comprising:
  (1) a first compartment and
  (2) a second compartment;
(ii) a cable, contained within the first compartment; and
(iii) a battery pack for the mobile device, contained within the second compartment,
wherein the mobile device battery pack comprises:
  (1) a bottom section comprising:
    (A) a base front surface;
    (B) a base back surface;
    (C) a battery cell, contained between the base front surface and the base back surface, wherein a housing of the mobile device will be placed against the base front surface; and
    (D) electronic circuitry, coupled to the battery cell; and
  (2) a top section, optionally attached to the bottom section,
  wherein a first open-polygon opening for the bottom section merges with a second open-polygon opening for the top section to form a cavity of the battery pack through which a screen of the mobile device will be visible, the cavity having a closed-polygon shape; and
the top section and the bottom section together substantially replicate an external shape of the mobile device.

40. A case for an electronic device comprising:
a lower case portion comprising:
   a base surface upon which a back of a housing of the electronic device will be placed against, wherein the base surface comprises a top edge;
   a battery, enclosed in the lower case portion;
   electronic circuitry, coupled to the battery;
   a lower sidewall, connected to the base surface at an end opposite of the top edge, that will be positioned against a bottom side edge of the electronic device;
   an inner connector, on the lower sidewall, positioned to connect to a connector of the electronic device, and coupled through the electronic circuitry to the battery; and
   an outer connector, positioned on an outside bottom side of the lower case portion, coupled through the electronic circuitry to the battery and inner connector; and
an upper case portion comprising:
   an upper sidewall that will be positioned against a top side edge of the electronic device when the upper case portion is seated against the lower case portion; and
   an open side end, opposite of the upper sidewall,
wherein the upper case portion slides onto the lower case portion through the open side end in a direction along the base surface from the top edge to the lower sidewall,
wherein when the upper case portion is seated against the lower case portion, the upper and lower case portions meet at and form a seam which extends across a back of the case,
wherein the top section and the bottom section together substantially replicate an external shape of the mobile device, and
when the upper case portion is seated against the lower case portion, a first open-polygon-shaped opening for the lower case portion merges with a second open-polygon-shaped opening for the upper case portion to form a front opening of the case through which a screen of the electronic device will be visible, the front opening having a closed shape.

41. A case for an electronic device comprising:
a first case portion comprising:
   a base surface upon which a back of a housing of the electronic device will be placed against, wherein the base surface comprises a top edge;
   a battery, enclosed in the first case portion;
   electronic circuitry, coupled to the battery;
   a lower sidewall, connected to the base surface at an end opposite of the top edge, that will be positioned against a bottom side edge of the electronic device;
   an inner connector, on the lower sidewall, positioned to connect to a connector of the electronic device, and coupled through the electronic circuitry to the battery; and
   an outer connector, positioned on an outside of the first case portion, coupled through the electronic circuitry to the battery and inner connector; and
a second case portion comprising:
   an upper sidewall that will be positioned against a top side edge of the electronic device when the second case portion is seated against the first case portion; and
   an open side end, opposite of the upper sidewall,
wherein the second case portion slides onto the first case portion through the open side end,
wherein when the second case portion is seated against the first case portion, the first and second case portions meet at and form a seam which extends across a back of the case,
wherein the top section and the bottom section together substantially replicate an external shape of the mobile device, and
when the second case portion is seated against the first case portion, a first open-shaped opening for the first case portion merges with a second open-shaped opening for the second case portion to form a front opening of the case through which a screen of the electronic device will be visible, the front opening having a closed shape.

42. A method of making an electronic device case comprising:
providing a lower case portion of the electronic device case comprising a base front surface and base back surface, wherein a housing of an electronic device will be placed against the base front surface;
enclosing a battery between the base front surface and base back surface;
connecting electronic circuitry to the battery and an inner and outer connector; and
providing an upper case portion for the electronic device case that slides onto the lower case portion, wherein when the upper case portion is seated against the lower case portion, the upper and lower case portions form a seam which extends across a back of the case, and
when the upper case portion is seated against the lower case portion, a first open-shaped opening for the lower case portion merges with a second open-shaped opening for the upper case portion to form a front opening of the case through which a screen of the electronic device will be visible, the front opening having a closed shape; and
wherein the top section and the bottom section together substantially replicate an external shape of the mobile device.

43. A method of making an electronic device case comprising:
providing a first case portion of the electronic device case comprising a base front surface and base back surface, wherein a housing of an electronic device will be placed against the base front surface;
enclosing a battery between the base front surface and base back surface;
connecting electronic circuitry to the battery and an inner and outer connector, wherein the electronic circuitry implements a charging mode during which the battery can be charged via the outer connector, and a sync mode during which an electronic device when coupled to the inner connector can be synchronized with another electronic device coupled to the outer connector; and
providing a second case portion for the electronic device case that slides onto the first case portion, wherein when the second case portion is seated against the first case portion, the first and second case portions form a seam which extends across a back of the case, and
when the second case portion is seated against the first case portion, a first open-shaped opening for the first case portion merges with a second open-shaped opening for the second case portion to form a front opening of the case through which a screen of the electronic device will be visible, the front opening having a closed shape; and wherein the top section and the bottom section together substantially replicate an external shape of the mobile device.

44. A battery pack for a mobile device comprising:
(i) a bottom section comprising:
   (1) a back plane upon which a back of a housing of the mobile device will be placed against, wherein the back plane comprises a top edge;
   (2) a battery cell, enclosed in the bottom section;
   (3) electronic circuitry, coupled to the battery cell;
   (4) a bottom sidewall, connected to the back plane at an end opposite of the top edge, that will be positioned against a bottom side edge of the mobile device;
   (5) an internal interface, on the bottom sidewall, positioned to connect to an interface on the mobile device, and coupled through the electronic circuitry to the battery cell; and
   (6) an external interface, positioned on an outside bottom side of the bottom section, coupled through the electronic circuitry to the battery cell and internal interface; and
   (7) a component connected to the electronic circuitry selected from the group consisting of:
      (A) a button, coupled directly and mechanically to a back surface of the bottom section; and
      (B) a plurality of LED lights, wherein the LED lights indicate a charge level for the battery cell; and
(ii) a top section comprising:
   (1) a top side that will be positioned against a top side edge of the mobile device when the top section is seated against the bottom section; and
   (2) an open side end, opposite of the top side, wherein the top section slides onto the bottom section through the open side end,
   wherein when the top section is seated against the bottom section, the top and bottom sections meet at and form a seam which extends across a back of the battery pack, and
   when the top section is seated against the bottom section, a first open-polygon- shaped opening for the bottom section merges with a second open- polygon-shaped opening for the top section to form a cavity of the battery pack through which a screen of the mobile device will be visible, the cavity having a closed shape.

45. A method comprising the steps of:
(a) providing a first case portion of a battery pack for a mobile device, the first case portion comprising:
   (i) a base front surface, and
   (ii) a base back surface, wherein a housing of the mobile device will be placed against the, base front surface;
(b) enclosing a battery cell between the base front surface and base back surface;
(c) connecting electronic circuitry to the battery cell, to an internal interface, and to an external interface;
   wherein the internal interface is adapted to interface with an interface of the mobile device;
(d) providing a second case portion of the battery pack for the mobile device that slides onto the first case portion, wherein when the second case portion is seated against the first case portion, the first and second case portions form a seam which extends across a back of the battery pack; and
(e) forming on the first case portion a guide in a sidewall and an insert section, wherein the second case portion slides on the guide and over the insert section and an edge of the second case portion overlaps with an edge of the first case portion to form a seam, and exterior surfaces of the first and second case portions at the seam become flush with each other; and
when the second case portion is seated against the first case portion, a first open-shaped opening for the first case portion merges with a second open-shaped opening for the second case portion to form a cavity of the battery pack through which a screen of the mobile device will be visible, the cavity having a closed shape.

46. A method comprising the steps of:
(a) providing a first case portion of a battery pack for a mobile device, the first case portion comprising:
   (i) a first end;
   (ii) a second end, opposite of the first end;
   (iii) a base front surface; and
   (iv) a base back surface wherein a housing of the mobile device will be placed against the base front surface, and the mobile device comprises an interface for supplying power to the mobile device;
(b) enclosing a battery cell between the base front surface and base back surface;
   wherein the battery comprises a third end and a fourth end, opposite of the third end;
(c) positioning an internal connector of the first case portion closer to the third end of the battery cell than the fourth end of the battery cell;
   wherein the fourth end of the battery cell is closer to the first end of the first case portion than it is to the second end, and the first end will be closer than the second end is to a side edge of the electronic device that is opposite of the device connector;
(d) coupling electronic circuitry to the battery cell, to an internal interface, and to an external interface; and
(e) providing a second case portion of the battery pack for the mobile device that slideably couples to the first case portion,
   wherein when the second case portion is seated against the first case portion, the first and second case portions form a seam which extends across a back of the battery pack; and
   when the first case portion is seated against the second case portion, a first open-shaped opening for the first case portion merges with a second open-shaped opening for the second case portion to form a cavity of the battery pack through which a screen of the mobile device will be visible, the cavity having a closed shape.

47. A battery pack for a mobile device, the battery pack comprising:
(i) a first case portion comprising:
   (1) a back plane comprising
      (a) a base front surface; and
      (b) a base back surface;
         wherein a housing of a mobile device will be placed against the base front surface;
   (2) a battery cell, enclosed within a thickness of the back plane and between the base front surface and base back surface;
   (3) electronic circuitry, coupled to the battery cell, to an internal interface, and to an external interface;
      wherein the internal interface connects to an interface of the mobile device; and
   (4) a guide on a sidewall; and
   (5) an insert section; and
(ii) a second case portion, slideable onto the first case portion;

wherein, when the second case portion slides on the guide of the first case portion and over the insert section to attach to the first case portion, edges of the first and second case portion overlap with each other to form a seam, and exterior surfaces of the first and second case portions at the seam become flush with each other;

wherein, when the second case portion is seated against the first case portion, the first and second case portions form a seam which extends across a back of the battery pack;

when the second case portion is seated against the first case portion, a first open-shaped opening for the first case portion merges with a second open-shaped opening for the second case portion to form a cavity of the battery pack through which a screen of the mobile device will be visible, the cavity having a closed shape.

48. A battery pack for a mobile device, the battery pack comprising:
(i) a first case portion comprising:
  (1) a first end;
  (2) a second end, opposite of the first end
  (3) a base front surface; and
  (4) a base back surface;
  wherein a housing of a mobile device will be placed against the base front surface, and the mobile device comprises an interface for supplying power to the mobile device;
  (5) a battery cell enclosed between the base front surface and the base back surface;
  wherein the battery comprises a third end and a fourth end, opposite of the third end;
  (6) an internal interface, positioned closer to the third end of the battery than the fourth end of the battery
  wherein the fourth end of the battery is closer to the first end of the first case portion than it is to the second end of the first case portion;
  wherein the first end of the first case portion will be closer than the second end of the first case portion to a side edge of the mobile device that is opposite of the interface of the mobile device;
  (7) electronic circuitry, coupled to the battery cell, to the internal interface, and to an external interface;
(ii) a second case portion that slideably couples to the first case portion;
  wherein when the second case portion is seated against the first case portion, the first and second case portions form a seam which extends across a back of the battery pack, and
  when the first case portion is seated against the second case portion, a first open-polygon-shaped opening for the first case portion merges with a second open-polygon-shaped opening for the second case portion to form a cavity of the battery pack through which a screen of the mobile device will be visible, the cavity having a closed shape.

49. A battery pack for a mobile device comprising:
(i) a bottom section comprising:
  (1) a back plane upon which a back of a housing of the mobile device will be placed against, wherein the back plane comprises a top edge;
  (2) a battery cell, enclosed in the bottom section;
  (3) electronic circuitry, coupled to the battery cell;
  (4) a bottom sidewall, connected to the back plane at an end opposite of the top edge, that will be positioned against a bottom side edge of the mobile device;
  (5) an internal interface, on the bottom sidewall, positioned to connect to an interface on the mobile device, and coupled through the electronic circuitry to the battery cell; and
  (6) an external interface, positioned on an outside bottom side of the bottom section, coupled through the electronic circuitry to the battery cell and internal interface;
  (7) a button, coupled to the electronic circuitry; and
  (8) a plurality of LED lights, coupled to the electronic circuitry, and wherein the LED lights indicate a power or charge level for the battery cell; and
(ii) a top section comprising:
  (1) a top side that will be positioned against a top side edge of the mobile device when the top section is seated against the bottom section; and
  (2) an open side end, opposite of the top side,
  wherein the top section slides onto the bottom section through the open side end,
  wherein when the top section is seated against the bottom section, the top and bottom sections meet at and form a seam which extends across a back of the battery pack, and
  when the top section is seated against the bottom section, a first open-polygon-shaped opening for the bottom section merges with a second open-polygon-shaped opening for the top section to form a cavity of the battery pack through which a screen of the mobile device will be visible, the cavity having a closed shape.

50. A battery pack for a mobile device comprising:
(i) a bottom section comprising:
  (1) a back plane upon which a back of a housing of the mobile device will be placed against, wherein the back plane comprises a top edge;
  (2) a battery cell, enclosed in the bottom section;
  (3) electronic circuitry, coupled to the battery cell;
  (4) a bottom sidewall, connected to the back plane at an end opposite of the top edge, that will be positioned against a bottom side edge of the mobile device;
  (5) an internal interface, on the bottom sidewall, positioned to connect to an interface on the mobile device, and coupled through the electronic circuitry to the battery cell; and
  (6) an external interface, positioned on an outside bottom side of the bottom section, coupled through the electronic circuitry to the battery cell and internal interface; and
(ii) a top section comprising:
  (1) a top side that will be positioned against a top side edge of the mobile device when the top section is seated against the bottom section; and
  (2) an open side end, opposite of the top side,
  wherein the top section slides onto the bottom section through the open side end,
  wherein when the top section is seated against the bottom section, the top and bottom sections meet at and form a seam which extends across a back of the battery pack,
  wherein the battery cell can be charged via the external interface and wherein the mobile device, when coupled to the internal interface, can communicate with an external device via the external interface,
  wherein a plurality of LED lights, visible on the back of the battery pack, indicate a power or charge level of the battery cell, and when the top section is seated against the bottom section, a first open-polygon-shaped opening for the bottom section merges with a second open-polygon-shaped opening for the top section to form a cavity of the battery pack through which a screen of the mobile device will be visible, the cavity having a closed shape.

* * * * *